(12) United States Patent
Konno et al.

(10) Patent No.: US 8,307,322 B2
(45) Date of Patent: Nov. 6, 2012

(54) WIRING DESIGN APPARATUS

(75) Inventors: Eiichi Konno, Kawasaki (JP); Yoshitaka Nishio, Kawasaki (JP); Takao Yamaguchi, Kawasaki (JP); Toshiyasu Sakata, Kawasaki (JP); Takahiko Orita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 443 days.

(21) Appl. No.: 12/574,071

(22) Filed: Oct. 6, 2009

(65) Prior Publication Data
US 2010/0106274 A1 Apr. 29, 2010

(30) Foreign Application Priority Data
Oct. 23, 2008 (JP) .................. 2008-272961

(51) Int. Cl.
*G06F 17/50* (2006.01)
(52) U.S. Cl. ......... 716/126; 716/104; 716/132; 716/139
(58) Field of Classification Search .................. 716/104, 716/126, 132, 139
See application file for complete search history.

(56) References Cited

U.S. PATENT DOCUMENTS
5,583,788 A * 12/1996 Kuribayashi .................. 716/129

FOREIGN PATENT DOCUMENTS
| JP | 62-115574 | 5/1987 |
| JP | 5-67178 | 3/1993 |
| JP | 6-266804 | 9/1994 |
| JP | 2000-259685 | 9/2000 |

* cited by examiner

*Primary Examiner* — Thuan Do
(74) *Attorney, Agent, or Firm* — Staas & Halsey LLP

(57) ABSTRACT

A wiring design apparatus includes a first acquirer that acquires a first wiring block whose region has a maximum number of crossings with regions of other wiring blocks from printed circuit board data of a printed circuit board having a plurality of wiring blocks with a specific region on a wiring layer, a second acquirer that acquires second wiring blocks whose region does not cross the first wiring block from the printed circuit board data, and a wiring execution requester that causes a wiring processor to perform wiring processing on the first wiring block and the second wiring blocks in parallel.

8 Claims, 27 Drawing Sheets

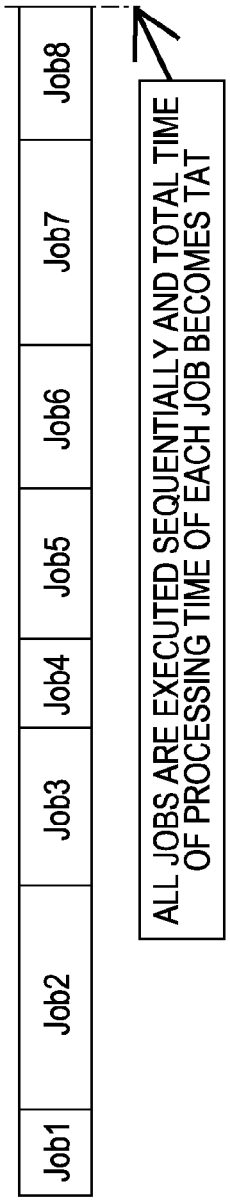
FIG. 1A PRIOR ART
ALL JOBS ARE EXECUTED SEQUENTIALLY AND TOTAL TIME OF PROCESSING TIME OF EACH JOB BECOMES TAT
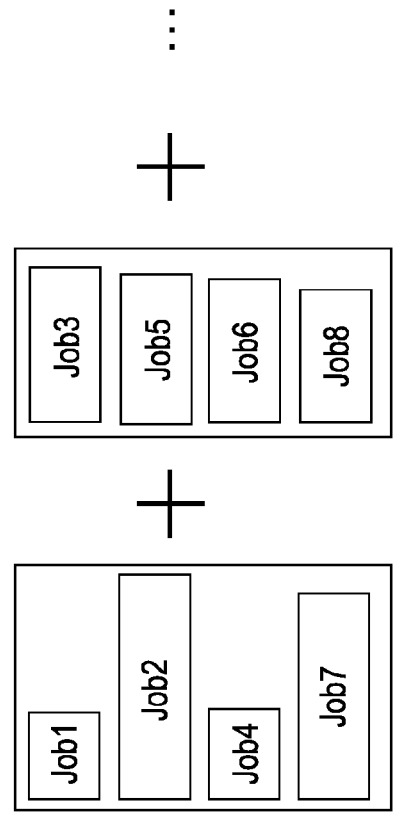
FIG. 1B
DIVIDED JOBS THAT CAN BE EXECUTED SIMULTANEOUSLY IN PARALLEL ARE GROUPED AND SUCH GROUPS ARE EXECUTED SEQUENTIALLY. THE SUM OF EXECUTION TIME OF THE JOB WHOSE PROCESSING IS THE SLOWEST IN EACH GROUP BECOMES TAT

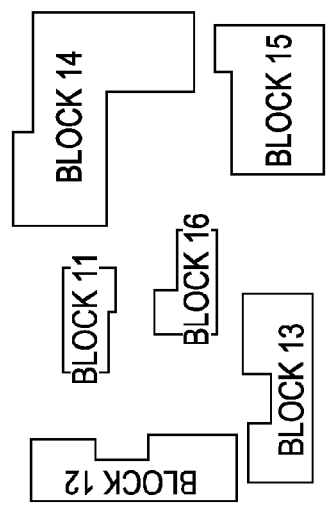
*FIG. 2A*
L1 LAYER
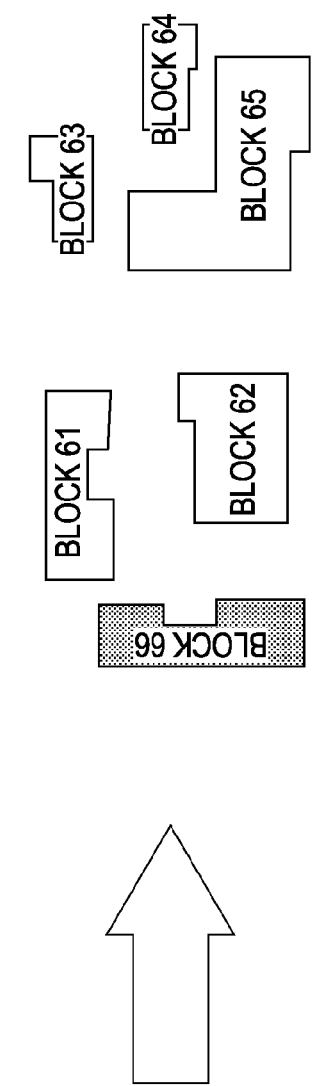
*FIG. 2B*
Ln LAYER
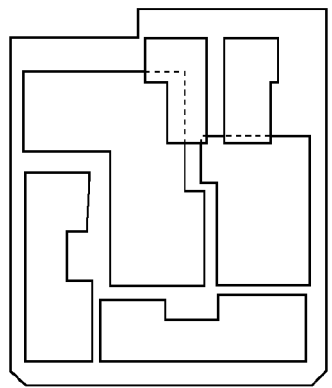

FIG. 4A

PRINTED CIRCUIT BOARD DATABASE

- PARTS INFORMATION
  - PARTS MOUNTING INFORMATION (XY, SURFACE, ANGLE)
  - PARTS PIN INFORMATION (X1, Y1,)
- BOARD INFORMATION
  - LAYER CONFIGURATION, BOARD SIZE AND SO ON
- LAYER INFORMATION
  - NUMBER OF LAYERS, ATTRIBUTES OF EACH LAYER AND SO ON
- NET INFORMATION [SIGNAL NAME]
  - SIGNAL NAME, VARIOUS NET PROPERTIES
  - WIRING TOPOLOGY NAME
- WIRING RESTRICTION INFORMATION [RESTRICTION CONDITION NAME]
  - SIGNAL LINE LENGTH CONDITION, EQUAL-LENGTH CONDITION
  - CROSS-TALK CONDITION OF WIRING ROUTE INTERNAL SIGNAL (CONDUCTOR INTERVAL, CONDUCTOR WIDTH, AND PARALLEL RUNNING LIMITATIONS)
- WIRING STRATEGY INFORMATION
  - ROUTE PATH (XY, WIDTH)
  - LAYER NUMBER
  - WIRING TOPOLOGY NAME
  - WIRING BLOCK NAME
  - BLOCK REGION SHAPE

FIG. 4B

| WIRING BLOCK NAME | INCLUSIVE NET | LAYER NUMBER | BLOCK SHAPE |
|---|---|---|---|
| BLOCK-001 | NET101, NET102, ... | L1 | p1, p2, p3, ···· px |
| BLOCK-002 | NET201, NET202, ... | L2 | p1, p2, p3, ···· py |
| BLOCK-003 | NET301, NET302, ... | L2 | p1, p2, p3, ···· pz |
| ... | ... | ... | ... |

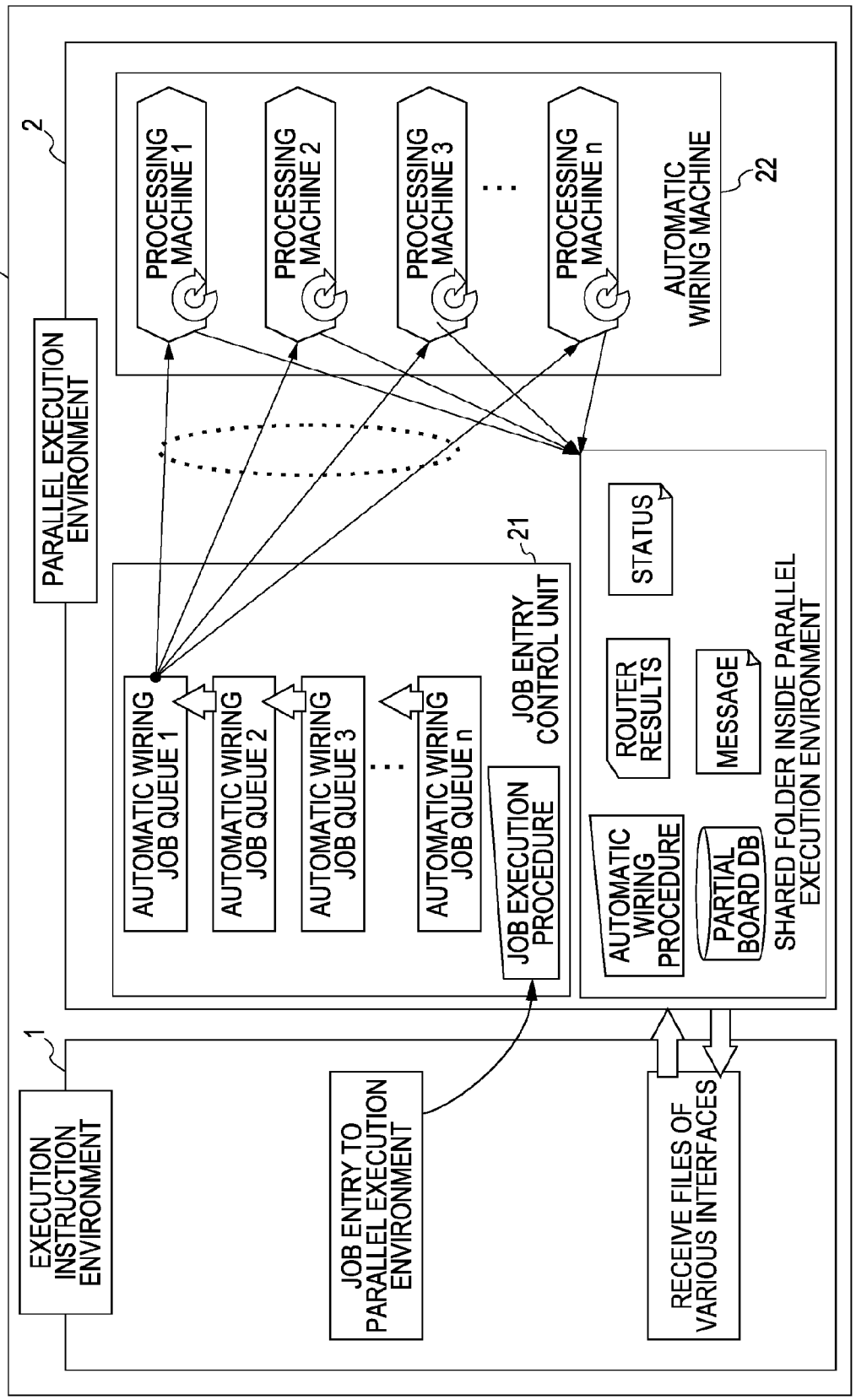

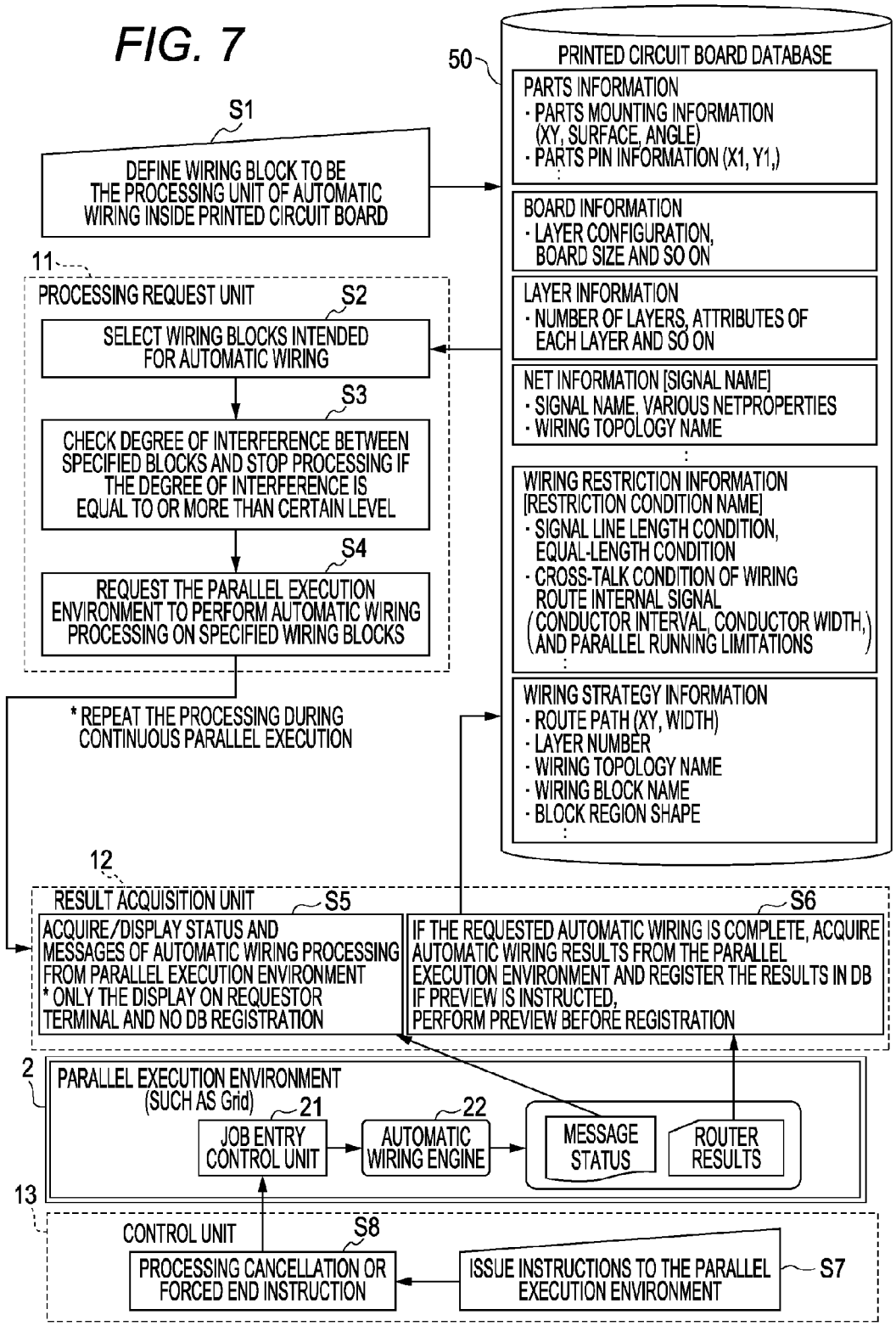

FIG. 12

| | PARALLEL EXECUTION REQUEST | PARALLEL ENVIRONMENT STATUS | AUTOMATIC WIRING OPTIONS |

AUTOMATIC WIRING STATUS LIST

NUMBER OF EXECUTION JOBS [ 12 ]

| No. | REQUEST INFORMATION | STATUS | EXECUTING MACHINE | OTHER INFORMATION |
|---|---|---|---|---|
| 1 | WIRING ROUTE NAME: IF10P_LV_I | COMPLETE (NOT ACQUIRED) | ar_server#001 | |
| 2 | WIRING ROUTE NAME: IF10P_LV_O | COMPLETE (ACQUIRED) | ar_server#002 | |
| 3 | WIRING ROUTE NAME: XRST_BIA | EXECUTING (00h01m23S) | ar_server#001 | |
| 4 | WIRING ROUTE NAME: TUPP1RECK | WAITING FOR EXECUTION IN QUEUE (n-TH) | UNKNOWN | |
| 5 | WIRING ROUTE NAME: CPUCLK1 | EXECUTING (00h08m54S) | ar_server#002 | |
| 6 | WIRING ROUTE NAME: SALM#1 | WAITING FOR EXECUTION IN QUEUE (m-TH) | UNKNOWN | |
| 7 | WIRING ROUTE NAME: SDRAM_A | COMPLETE (ACQUIRED) | ar_server#003 | |

( UPDATE TO THE LATEST INFORMATION )    ( ACQUIRE WIRING RESULTS OF SELECTED LINE )    ( CLOSE )

| AUTOMATIC WIRING BLOCK | CROSS BLOCK | CROSS NUMBER |
|---|---|---|
| A | B, I | 1 |
| B | A, D | 2 |
| C | D | 1 |
| D | B, C, E | 3 |
| E | D | 1 |
| F | – | 0 |
| G | – | 0 |
| H | I | 1 |
| I | A, H | 2 |

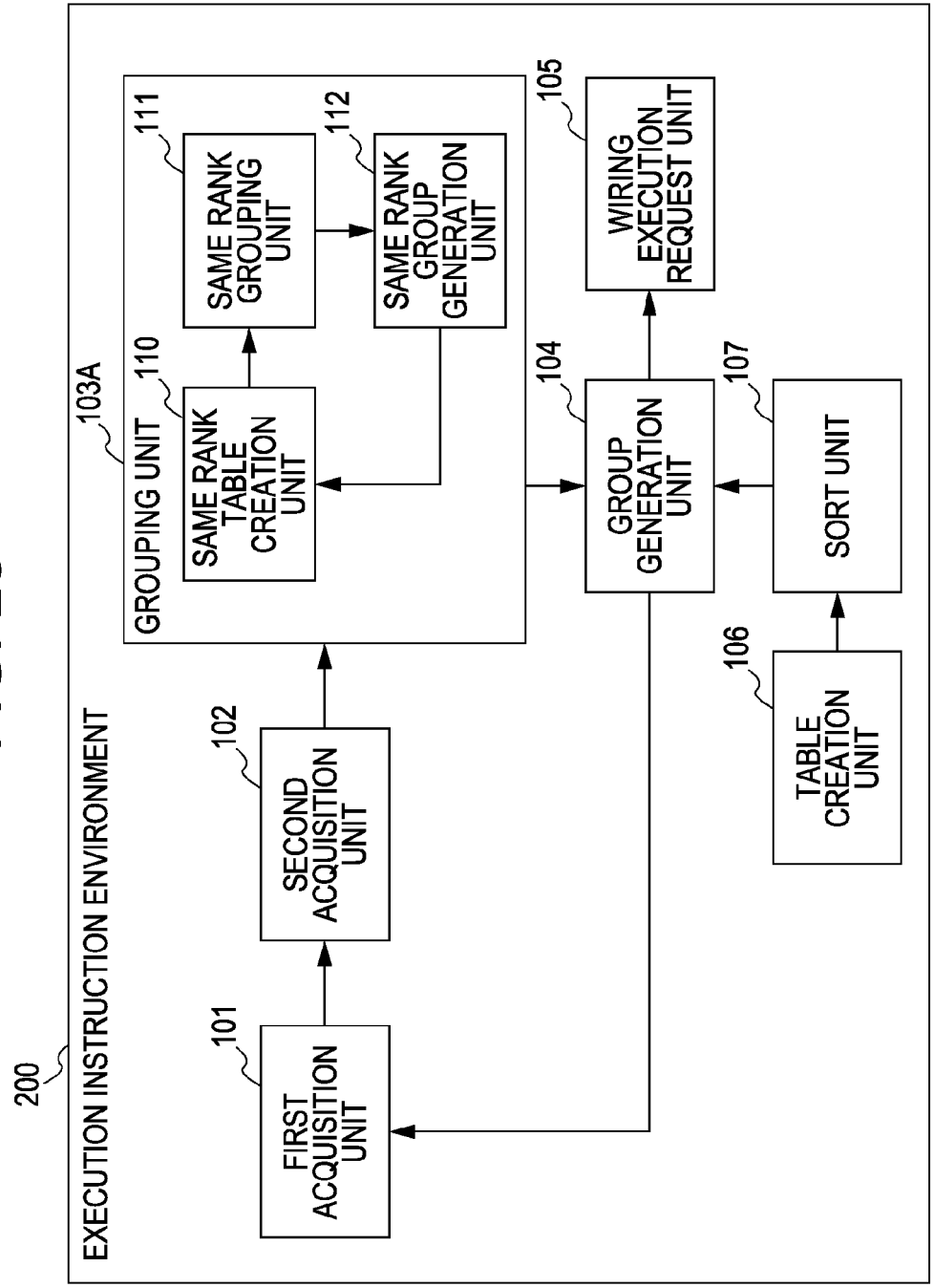

FIG. 24A

D, A, H, I ⟹ A GROUP | D, A, H

DIVIDING A, H, AND I INTO PARALLEL GROUPS FORMS TWO SAME RANK GROUPS OF WIRING BLOCKS (A, H) AND (I). WIRING BLOCKS IN THE SAME RANK GROUP WITH LARGER NUMBER OF WIRING BLOCKS ARE ADOPTED FOR A GROUP.

(a-1)

| WIRING BLOCK | CROSS BLOCK | CROSS NUMBER |
|---|---|---|
| A | I | 1 |
| I | A, H | 2 |
| H | I | 1 |

← SAME RANK GROUP (A, H)

(a-2)

| WIRING BLOCK | CROSS BLOCK | CROSS NUMBER |
|---|---|---|
| A | H | 1 |
| H | A | 1 |

← SAME RANK GROUP (I)

FIG. 24B

B, C, E, I ⟹ A GROUP | D, A, H
B GROUP | B, C, E, I

DIVIDING C, E, AND I INTO PARALLEL GROUPS SHOWS THAT ALL BLOCKS ARE INDEPENDENT AND FORMED INTO ONE SAME RANK GROUP (C, E, I). WIRING BLOCKS IN THE SAME RANK GROUP ARE ADOPTED FOR B GROUP.

AFTER ALL BLOCKS ARE EXTRACTED, BLOCKS WITH CROSS NUMBER 0 ARE MERGED.

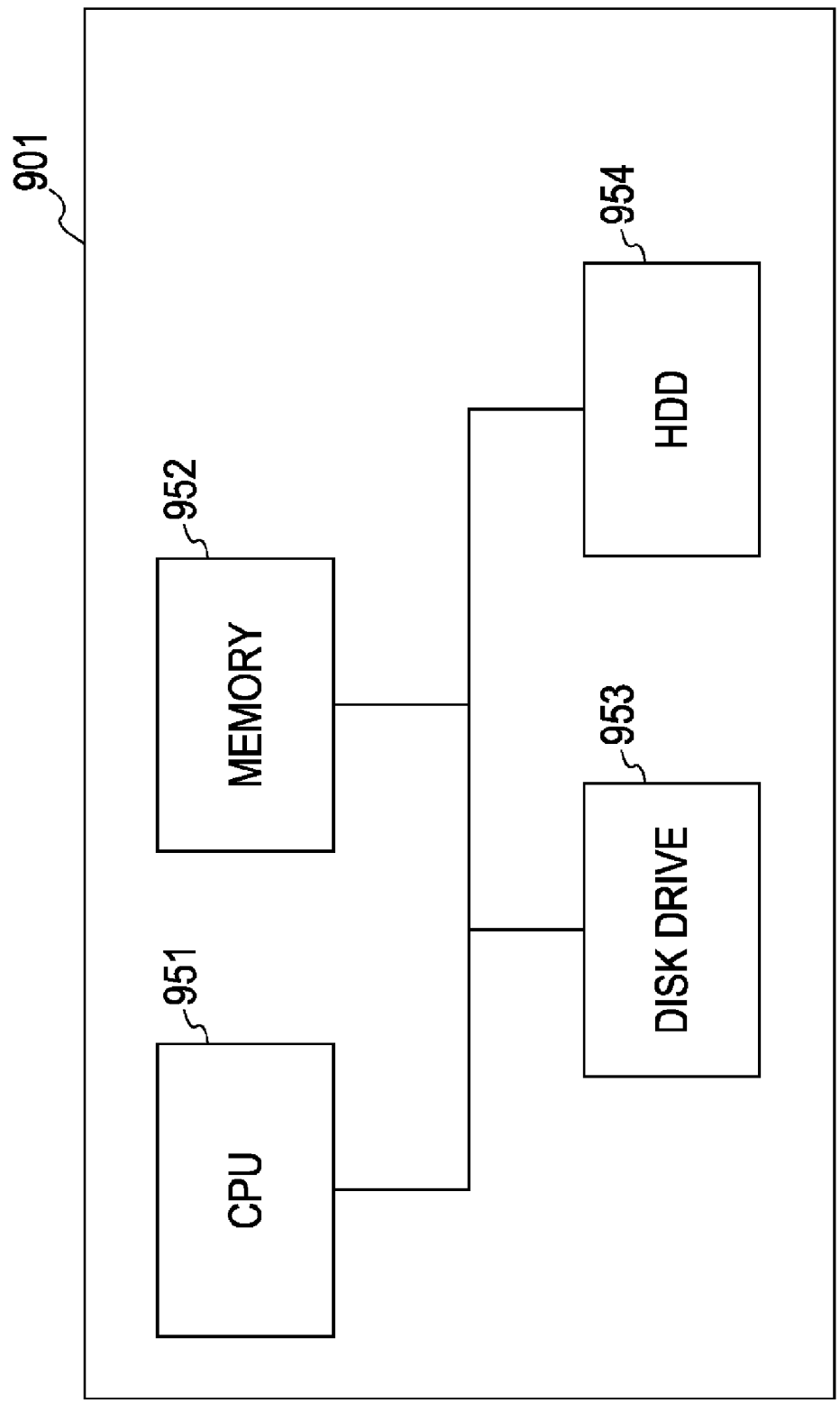

WIRING DESIGN APPARATUS

CROSS-REFERENCE TO RELATED APPLICATIONS

This application is based upon and claims the benefit of priority of the prior Japanese Patent Application No. 2008-272961, filed on Oct. 23, 2008, the entire contents of which are incorporated herein by reference.

BACKGROUND

1. Field

The embodiments discussed herein are related to a wiring design apparatus.

2. Description of the Related Art

In recent years, the amount of information handled by circuit equipment has increased steadily and printed circuit boards have also increased in size in synchronization therewith. With printed circuit boards increasing in size, the amount of wiring between part pins also increases, leading to a huge amount of design work.

Many techniques for automatically wiring a printed circuit board have been proposed. It is difficult to perform automatic wiring in parallel in consideration of interference between divided tasks. Automatic wiring in the past has been performed in sequential processing.

An automatic parallel wiring design system capable of performing parallel wiring design processing by a plurality of processors efficiently at high speed without degrading convergence of processing and causing an unintended increase in wiring length is disclosed. Also, a parallel wiring method capable of performing wiring processing of a pattern thereof in parallel at high speed in order to perform the wiring processing by using a plurality of computers and an automatic wiring processing methods that makes wiring processing faster and improves performance of wiring are disclosed. Further, a CAD apparatus capable of improving an operation speed thereof and the like by starting/closing design tools in accordance with progress of design work and that of processing by the design tools, reducing a wait time of a designer before design support processing is completed and a time and effort to activate design tools, and at the same time, improving resource usage conditions of design tools is disclosed.

[Patent Document 1]
Japanese Laid-open Patent Publication No. 6-266804
[Patent Document 2]
Japanese Laid-open Patent Publication No. 62-115574
[Patent Document 3]
Japanese Laid-open Patent Publication No. 5-67178
[Patent Document 4]
Japanese Laid-open Patent Publication No. 2000-259685

SUMMARY

According to an aspect of the invention, a wiring design apparatus comprises a first acquirer that acquires a first wiring block whose region has a maximum number of crossings with regions of other wiring blocks from printed circuit board data of a printed circuit board having a plurality of wiring blocks with a specific region on a wiring layer, a second acquirer that acquires second wiring blocks whose region does not cross the first wiring block from the printed circuit board data, and a wiring execution requester that causes a wiring processor to perform wiring processing on the first wiring block and the second wiring blocks in parallel.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

The above-described embodiments of the present invention are intended as examples, and all embodiments of the present invention are not limited to including the features described above.

BRIEF DESCRIPTION OF THE DRAWINGS

FIGS. 1A and 1B are schematic diagrams comparing sequential processing with parallel processing in a first embodiment.

FIGS. 2A and 2B are diagrams exemplifying the concept of a wiring block in a printed circuit board to be wired in the first embodiment.

FIGS. 4A and 4B illustrate a data structure of the wiring block in the first embodiment.

FIG. 6 provides an overview of the automatic wiring processing system by focusing on an interface file in the first embodiment.

FIG. 7 illustrates functional blocks of the automatic wiring processing system according to the first embodiment and operations of processing.

FIG. 12 illustrates a confirmation screen of status according to the first embodiment.

FIG. 23 illustrates the configuration of an execution instruction environment in the third embodiment.

FIGS. 24A, B, and C illustrate the generation method of a parallel execution group in the third embodiment.

FIG. 27 illustrates the hardware configuration of a main body unit in the computer system applied to the embodiments.

DETAILED DESCRIPTION OF THE PREFERRED EMBODIMENTS

Figure 3:
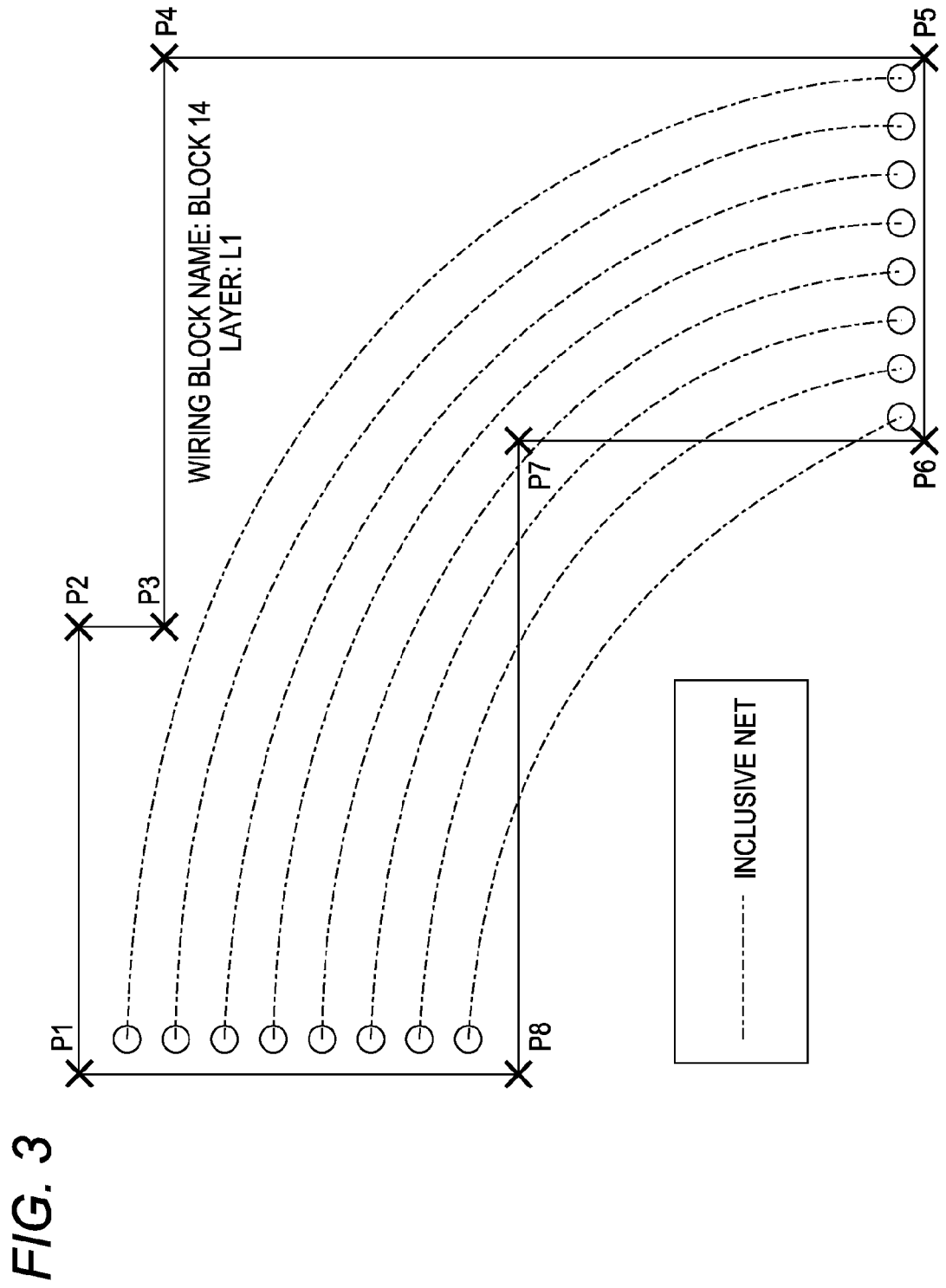
FIG. 3 illustrates attribute information of the wiring block in the first embodiment.

Reference may now be made in detail to embodiments of the present invention, examples of which are illustrated in the accompanying drawings, wherein like reference numerals refer to like elements throughout.

The embodiments of the present invention will be described below with reference to drawings. In the embodiments, a basic parallel processing technique for parallel processing and an automatic technique for automatically parallelizing all tasks based thereon optimally for execution will be described.

Performing automatic wiring processing of a printed circuit board by sequential processing means that a total value of a processing time of each piece of automatic wiring processing will be a TAT (Turn Around Time). Thus, the TAT can be reduced by performing the automatic wiring processing as parallel processing as much as possible.

The present invention has been made to solve the above problem and realizes automatic wiring processing in parallel by adopting a technique in which interference between tasks does not occur.

Accordingly, the maximum value of one piece of work becomes the total processing time by providing as many computers as the number of work units that can be parallelized. Therefore, the TAT concerning wiring of printed circuit board design can significantly be reduced so that efficient use of the design period can be made.

First Embodiment

First, a schematic diagram comparing sequential processing with parallel processing in the first embodiment is illustrated in FIGS. 1A and 1B. The horizontal axis of the schematic diagram in FIG. 1A shows the processing time. In the sequential processing, the total value of the processing time of each job becomes the TAT (see FIG. 1A). In the first embodiment, on the other hand, jobs that can be executed in parallel are grouped. Jobs in a group are executed as parallel processing and groups are executed as sequential processing (see FIG. 1B). With such parallel processing being performed, the total of execution time of jobs that take the longest processing time in each group becomes the TAT.

Jobs in the first embodiment refers to processing on each wiring block obtained by logically dividing a board on which wiring processing should be performed.

A wiring block is a region on a printed circuit board shown as coordinate information and is defined as a region including at least one piece of wiring information between terminals wired on the printed circuit board. A wiring block is defined by a wiring target net, wiring layer, and wiring area. The wiring target net is wired in a region of the wiring block. In the first embodiment, the unit of wiring block is defined as the unit of a job of automatic wiring execution. Also in the first embodiment, interference between wiring blocks is suppressed to perform automatic wiring in parallel. As a result, wiring processing of each wiring block can be performed as an independent job. That is, parallel execution becomes realizable.

FIGS. 2, 3, and 4 illustrate diagrams of concept of wiring blocks on a printed circuit board to be wired. In the example in FIGS. 2A and 2B, blocks 11 to 16 are defined in an L1 layer of the board to be wired. Blocks 62 to 66 are defined in an Ln layer. In this manner, wiring blocks are defined for each layer of the board to be automatically wired.

Attribute information of a wiring block will be described with reference to the diagram of concept of a wiring block in FIG. 3 and an example of data structure of wiring blocks in FIGS. 4A and 4B.

A wiring block is constituted by four attribute information such as a wiring block name, layer number, block shape, and inclusive net. Attribute information of the wiring block can be described as follows: the wiring block name is an identification name to uniquely decide the wiring block and the layer number shows in which layer the wiring block is located.

The block shape shows a region of the wiring block by coordinate values on a board and a closed section enclosed by each coordinate value is the region of the wiring block. The inclusive net shows which net is included in the wiring block and identification information that can uniquely identify a net, which is wiring information between terminals, is held in a data structure of the wiring block.

Each piece of attribute information, the wiring block name, layer number, and block shape of the wiring block, is held in a wiring strategy information table in a printed circuit board database and information in net information is referenced via a wiring topology name (inclusive net).

Figure 5:
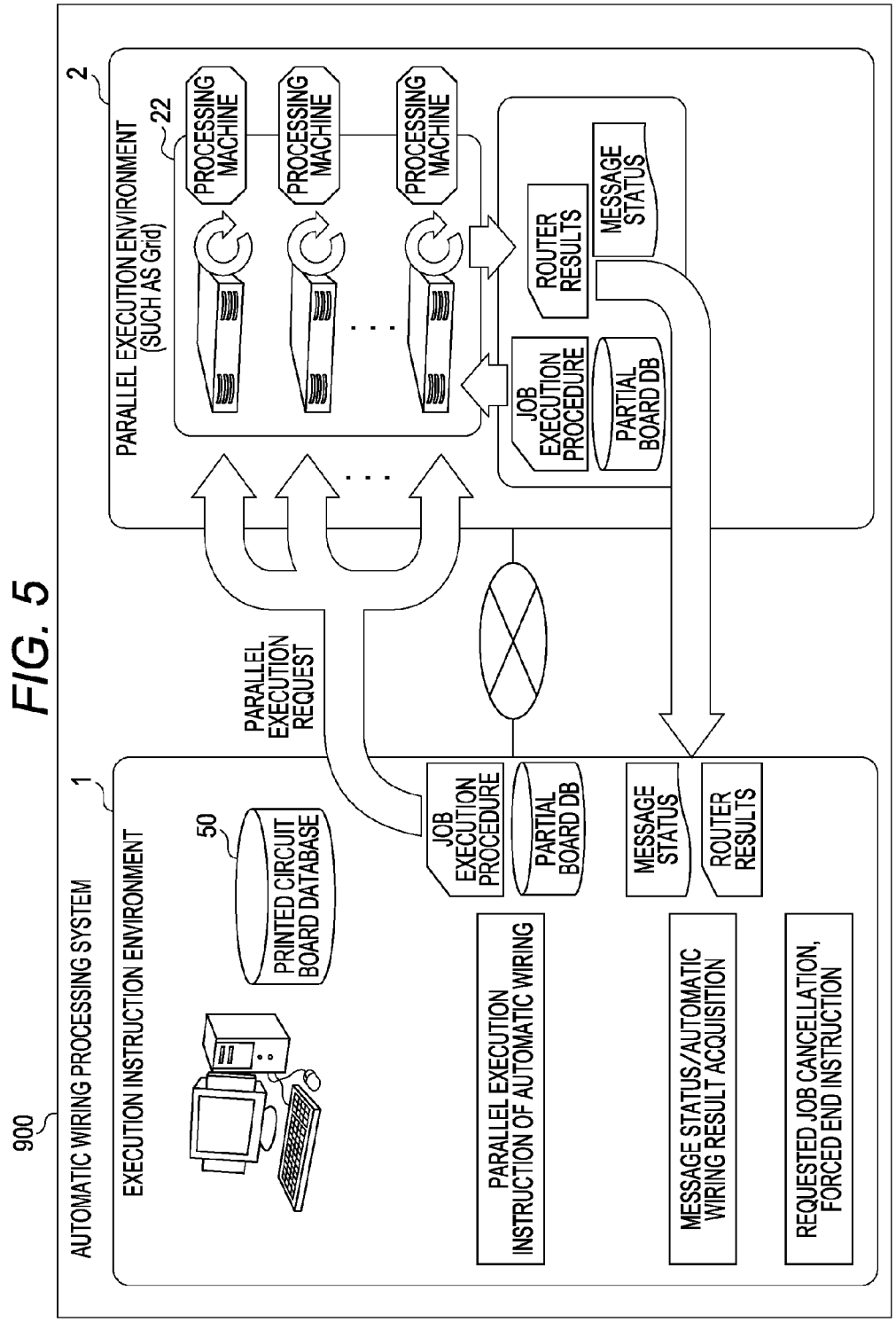
FIG. 5 provides an overview of the configuration of an automatic wiring processing system in the first embodiment.

Next, an overview of an automatic wiring processing system that realizes parallel processing of automatic wiring is illustrated in FIG. 5.

An automatic wiring processing system 900 includes an execution instruction environment 1 and a parallel execution environment 2. The execution instruction environment 1 provides a parallel execution instruction of automatic wiring, cancellation of a request job, and forced end instruction to the parallel execution environment 2. The execution instruction environment 1 also acquires automatic wiring processing results (router results), status of processing conditions, and messages from the parallel execution environment 2.

The execution instruction environment 1 holds a printed circuit board database 50 holding information about LSI to be created. As shown in FIG. 4, various kinds of information such as parts information, board information, layer information, net information, wiring restriction information, and wiring strategy information are held in the printed circuit board database 50.

The parallel execution environment 2 acquires a parallel execution instruction of automatic wiring from the execution instruction environment 1 to perform parallel processing of automatic wiring by an automatic wiring engine 22 including a plurality of automatic wiring processing machines. The parallel execution environment 2 also transmits a message being processed, status, and automatic wiring processing results to the execution instruction environment 1. Further, when a job cancellation or a forced end instruction is received from the execution instruction environment 1, the parallel execution environment 2 cancels or forcibly ends the relevant job.

Next, an overview of the automatic wiring processing system 900 by focusing on an interface file transmitted/received between the execution instruction environment 1 and the parallel execution environment 2 is illustrated in FIG. 6. The automatic wiring processing system 900 realizes parallel operations of automatic wiring utilizing the parallel execution environment by linking the execution instruction environment 1 and the parallel execution environment 2 through a file via a network. Details of the file will be described later.

With a job execution procedure file being transmitted by the execution instruction environment 1 to the parallel execution environment 2, the parallel execution environment 2 registers execution of the job execution procedure file in a job queue of a job entry controller 21. The execution instruction environment 1 also transmits an automatic wiring procedure file used for wiring processing together with the job execution procedure file and a partial board DB to the parallel execution environment 2 and the parallel execution environment 2 stores these transmitted files in a shared folder of the parallel execution environment 2.

The parallel execution environment 2 successively provides execution instructions of the registered job queue to the automatic wiring engine 22. The automatic wiring engine 22 successively outputs progress of current processing to the status file. When processing is completed, the automatic wiring engine 22 immediately outputs a router result file and a message file to the shared folder. The execution instruction environment 1 acquires the router result file, status file, and message file from the parallel execution environment 2 if necessary.

The parallel execution environment 2 processes jobs independently in job queues and thus, a state in which different requestors or boards of automatic wiring jobs are combined causes no problem.

Here, files necessary for performing automatic wiring in the parallel execution environment 2 will be described. In order to uniquely decide files to be used, a file name is decided in the present embodiment according to the naming rules below:

file identifier.user_name@IP_address-process_ID-native_ID-request_ID-model_name-model_version The partial board DB is a printed circuit board data file for automatic wiring program and is created by cutting out only information about a wiring block on which the wiring processing is performed from information in the printed circuit board database 50. The file identifier according to the above naming rules is defined as "rPTDB".

The job execution procedure file is a batch file or shell file that can be run on parallel execution machines and the file identifier according to the above naming rules is defined as "rExecute".

The automatic wiring procedure file is a file in which how to control and perform automatic wiring is described and the file identifier according to the above naming rules is defined as "rCf".

The router result file is a file in which wiring results by automatic wiring execution are stored and which conforms to a log format recoverable (displayable) in the execution instruction environment 1. The file identifier of the router result file according to the above naming rules is defined as "rResult".

The message file stores reports of results after performing automatic wiring processing as a file and the file identifier according to the above naming rules is defined as "rMessage".

The status file is a file that reflects operation conditions of automatic wiring operating in the parallel execution environment 2 and the file identifier according to the above naming rules is defined as "rStatus".

The partial board DB, job execution procedure file, and automatic wiring procedure file are transmitted from the execution instruction environment 1 to the parallel execution environment 2 when a job is requested and the router result file, message file, and status file are transmitted to the execution instruction environment 1 when the parallel execution environment 2 completes processing or a termination confirmation request is received from the execution instruction environment 1. Further, the status file is transmitted from the parallel execution environment 2 to the execution instruction environment 1 when a job condition confirmation request is received from the execution instruction environment 1.

Next, operations of the automatic wiring processing system 900 will be described while illustrating functional blocks of the automatic wiring processing system 900 and operations of processing in FIG. 7.

The automatic wiring processing system 900 includes, as described above, the execution instruction environment 1 and the parallel execution environment 2 and the execution instruction environment 1 includes a processing requester 11, a result acquirer 12, and a controller 13. On the other hand, the parallel execution environment 2 includes the job entry controller 21 and the automatic wiring engine 22.

Operations of the automatic wiring processing system 900 will be described. It is assumed for operations that wiring blocks on a printed circuit board to be processed are predefined by a user or another system (operation S1). The processing requester 11 selects wiring blocks intended for automatic wiring from the printed circuit board database 50 (hereinafter, selected wiring blocks are referred to as specified wiring blocks) (S2), checks the degree of interference between specified wiring blocks, and stops processing if the degree of interference is equal to or more than a certain level (S3). Next, the processing requester 11 requests the parallel execution environment 2 to perform wiring processing on specified wiring blocks (S4).

The job entry controller 21 of the parallel execution environment 2 registers an execution request in the job queue to cause the automatic wiring engine 22 to execute the job sequentially.

The automatic wiring engine 22 outputs progress of the job to the status file while the job is being executed and outputs an automatic wiring result (router result) of the job, status file, and message when the job is completed.

The result acquirer 12 acquires the status file and message file of the automatic wiring processing from the parallel execution environment 2 and presents the status and message to the user based on these acquired files (S5).

If the requested automatic wiring processing has been completed, the result acquirer 12 acquires automatic wiring results from the parallel execution environment 2 and registers the results in the printed circuit board database 50 (S6). If a preview of automatic wiring results is instructed from the user, a preview is performed before registration in the printed circuit board database 50 to wait for a registration instruction from the user.

When processing is canceled by the user or a forced end instruction is received (S7), the controller 13 issues the instruction to the job entry controller 21 of the parallel execution environment 2 (S8). The job entry controller 21 that received the instruction deletes the registration in the queue if the job is in the queue or outputs the forced end instruction to the automatic wiring engine 22 to forcibly end the job if the automatic wiring engine 22 is already performing processing of the job.

Figure 8A:
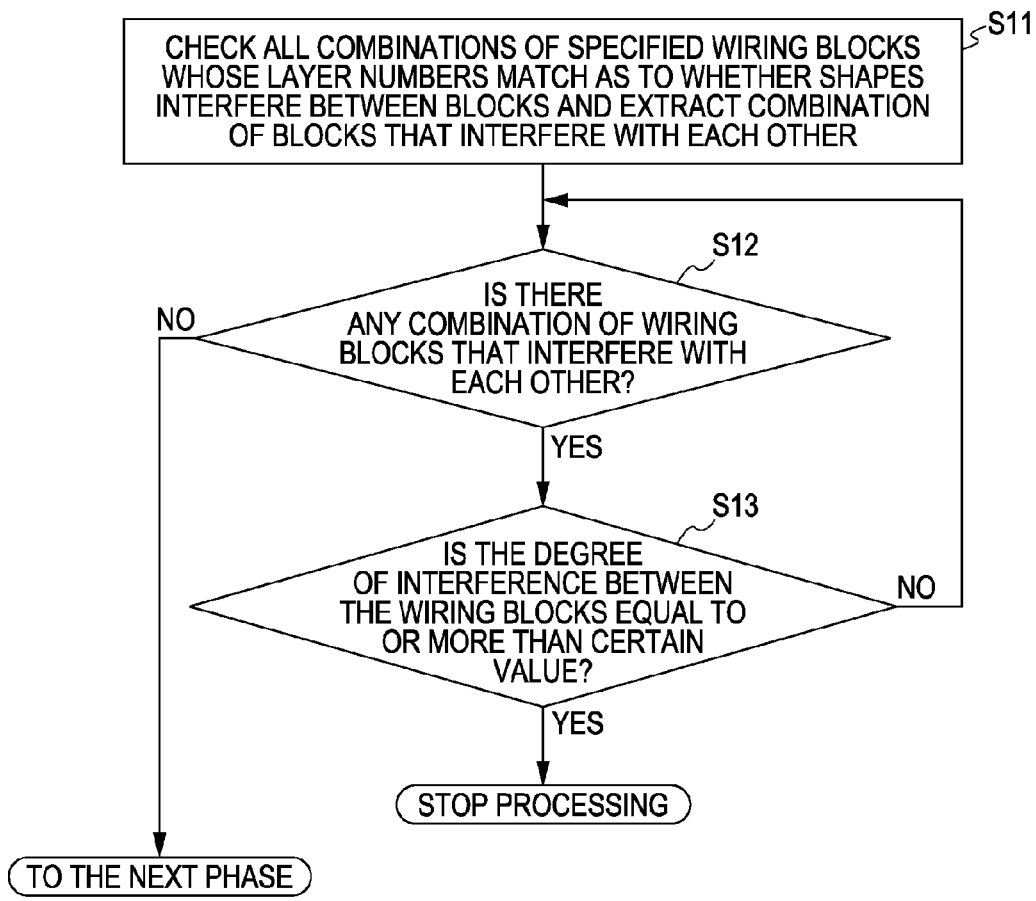
FIGS. 8A and 8B illustrate an operation S3 according to the first embodiment.
Figure 8B:
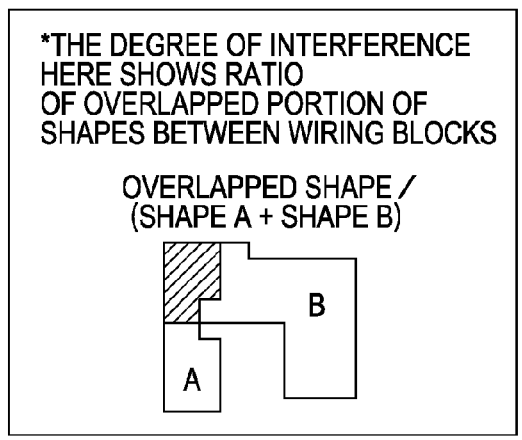

Next, detailed content of the above operation S3 is illustrated in FIGS. 8A and 8B. The processing requester 11 checks all combinations of specified wiring blocks whose layer numbers match whether shapes overlap and specified wiring blocks interfere and extracts all combinations of blocks that interfere with each other (S11).

Here, if any combination of specified wiring blocks that interfere with each other is present (S12, YES), the processing requester 11 determines whether the degree of interference between the wiring blocks is equal to or more than a certain value (S13). The degree of interference is a ratio of the area of the region of an overlapped portion to that of the whole region of shapes of wiring blocks.

If the degree of interference between the wiring blocks is equal to or more than the certain value (S13, YES), processing is stopped and, if the degree of interference is less than the certain value (S13, NO), the processing requester 11 returns to processing at S12 to repeat the processing at S12 and S13 until there is no combination of specified wiring blocks that interfere with each other. If there is no combination of wiring blocks that interfere with each other at S12 (S12, NO), processing continues to the next phase.

Figure 9:
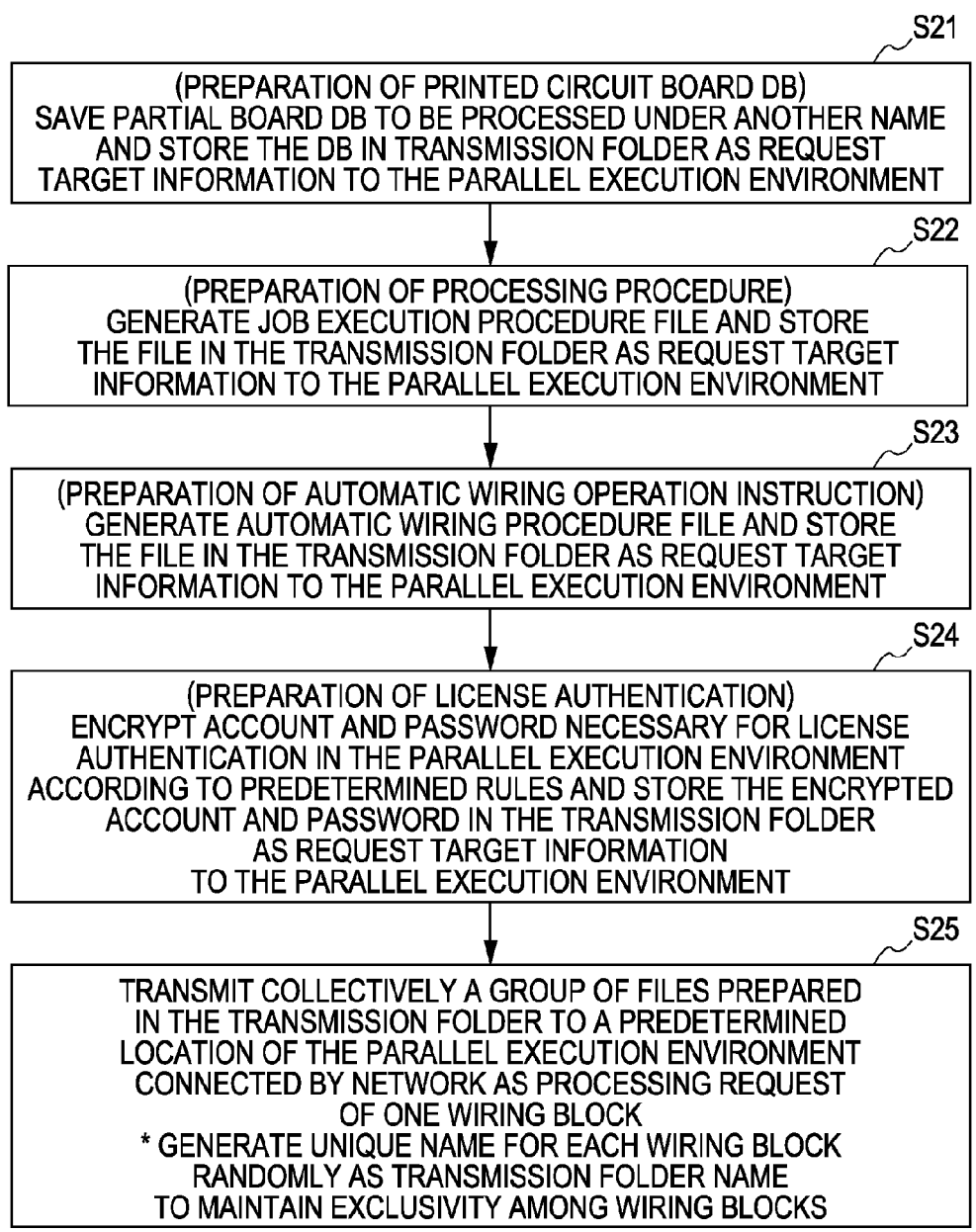
FIG. 9 illustrates operation S4 according to the first embodiment.

Next, detailed content of the above operation S4 will be described based on the flow chart in FIG. 9.

The processing requester 11 cuts out information on wiring blocks to be processed from the printed circuit board database 50 as a partial board DB, saves the partial board DB under another name, and stores the DB in a transmission folder of the processing requester 11 as request target information to the parallel execution environment 2 (S21). Next, the processing requester 11 generates a job execution procedure file and stores the file in the transmission folder as request information to the parallel execution environment 2 (S22).

The processing requester 11 generates an automatic wiring procedure file and stores the file in the transmission folder as request information to the parallel execution environment 2 (S23). Also, the processing requester 11 stores a file created by encrypting the account and password necessary for license authentication in the parallel execution environment 2 according to predetermined rules in the transmission folder as request information to the parallel execution environment 2 (S24).

The processing requester 11 collectively transmits a group of files stored in the transmission folder by processing of each of the above operations S21 to S24 to a predetermined folder of the parallel execution environment 2 connected by a network as a processing request of one wiring block (S25). Incidentally, the processing requester 11 randomly generates a unique name for each wiring block as a transmission folder name to maintain exclusivity among wiring blocks.

Figure 10:
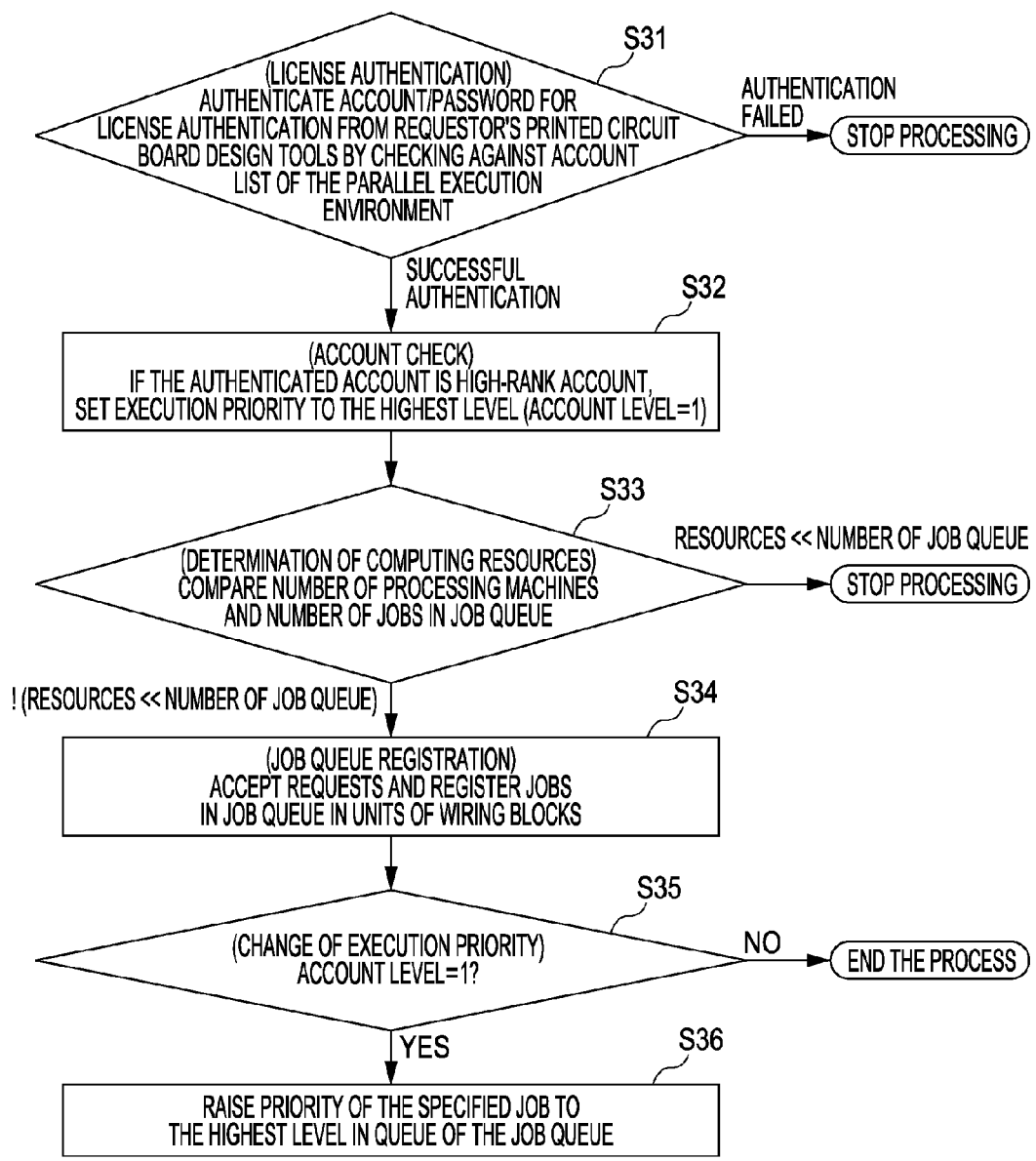
FIG. 10 illustrates operations of a JOB entry controller.

Next, operations of the job entry controller 21 in the parallel execution environment 2 will be described based on the flow chart in FIG. 10.

The job entry controller 21 opens the transmitted file of account and password information for license authentication and decrypts the account and password to determine whether the license can be authenticated by checking the account and password against an account list provided in the parallel execution environment 2 in advance (operation S31).

If the authentication is successful (S31, successful authentication), the job entry controller 21 sets the execution priority of the job to the highest account level (Level 1) if the authenticated account is a high-rank account with higher priority (S32).

The job entry controller 21 makes a comparison by determining the number of processing machines of the automatic wiring engine 22 and that of jobs present in the job queue (S33). If the number of processing machines is not far lower than that of jobs in the job queue (S33, !(resources<<number of jobs in the job queue)), the job entry controller 21 accepts requests from the execution instruction environment 1 and jobs are successively registered in the job queue in units of wiring processing on wiring blocks (S34).

The job entry controller 21 determines the account level of the job currently being processed (S35). If the account level is Level 1 (S35, YES), the job entry controller 21 raises the priority of the job to the highest level in the queue of the job queue (S36) before terminating processing by the job entry controller 21.

If authentication fails at S31 (S31, authentication failed), or the number of processing machines is far lower than that of jobs in the job queue (S33, (resources<<number of jobs in the job queue)), processing is stopped in both cases. If the account level is not Level 1 (S35, NO), processing by the job entry controller 21 is terminated.

The job entry controller 21 constantly monitors process operation states of each processing machine of the automatic wiring engine 22 and if there is any processing machine with available resources, a job registered in the job queue is put in at any time.

Next, detailed content of operation S6 in FIG. 7 will be described based on the flow chart in FIG. 11.

The result acquirer 12 acquires the status of the requested wiring block from the parallel execution environment 2 and, if wiring is completed, acquires a wiring result log (the status file, message file, and router result file) of the wiring block (S41).

Here, a confirmation screen of status is illustrated in FIG. 12. The result acquirer 12 presents request information about the requested wiring block (the wiring route name in FIG. 12), the status such as "Complete" of a job, "Executing", and "Waiting for execution in queue" in the standby state in a job queue, the processing machine (the execution machine in FIG. 12), and additional information (other information in FIG. 12) to the user and also displays the number of executed jobs, which is the number of jobs that have been executed. If the job status is "Complete", the result acquirer 12 displays information about whether the user has acquired router results. If the job status is "Executing", the result acquirer 12 displays the elapsed time of processing. Further, if the job status is "waiting for execution in queue", the result acquirer 12 displays the standby order in the waiting queue.

Further, if an "Update to the latest information" button is pressed in the screen, the result acquirer 12 acquires the status file from the parallel execution environment 2 and updates the display information. If a job whose status is "Complete" and whose router result is "Not acquired" is selected by the user (the selected list is displayed in reverse video) and then, a "Acquire wiring results of selected line" button is pressed, the result acquirer 12 acquires wiring results. An operation when wiring results are acquired will be described later.

Figure 11:
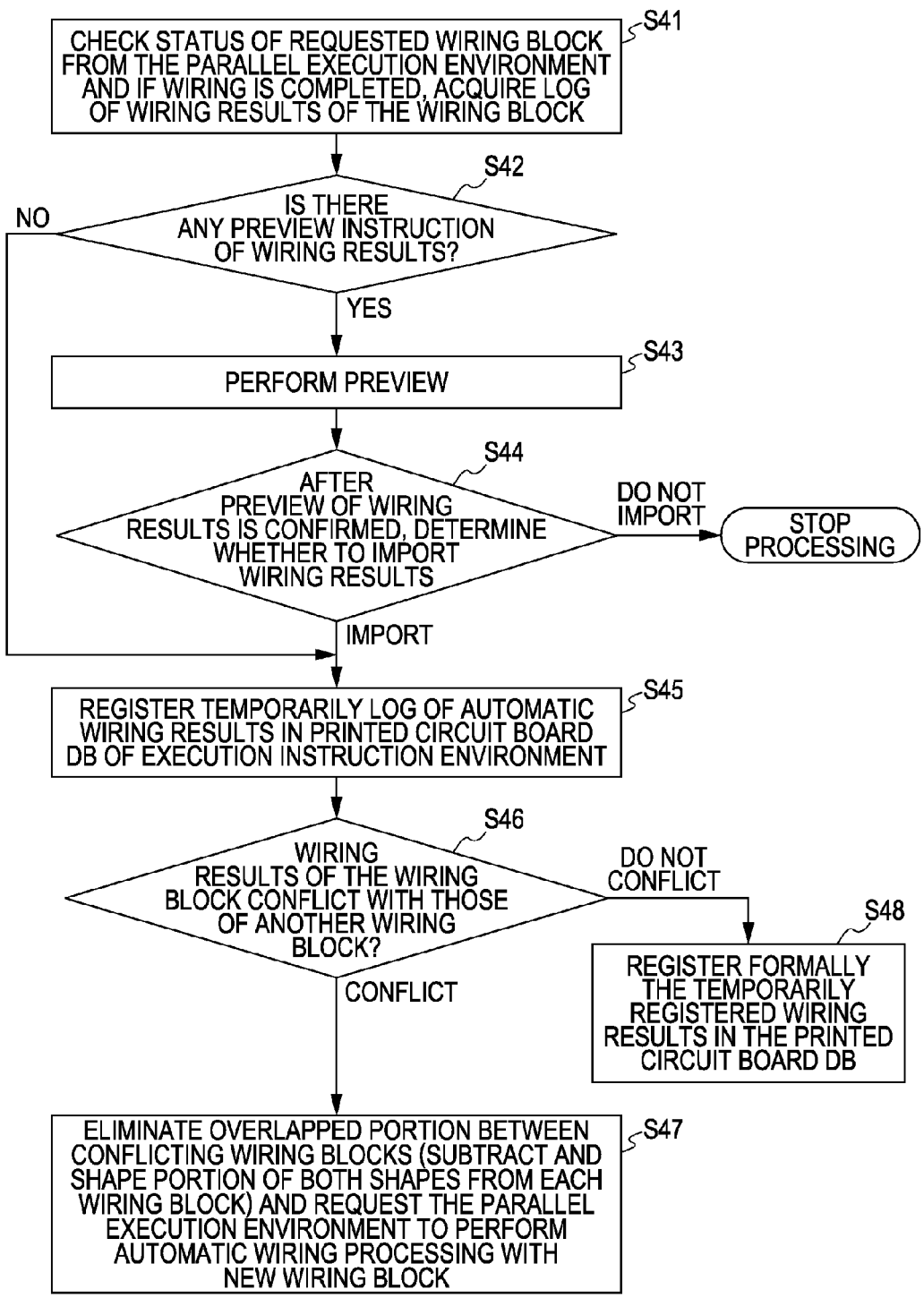
FIG. 11 illustrates detailed content of operation S6 according to the first embodiment.

The description returns to the flow chart in FIG. 11. Here, if a preview of wiring results is instructed by the user (S42, YES), the result acquirer 12 provides a preview of wiring result by superimposing the preview on the screen based on the wiring result log (S43). Next, after the preview of wiring results is confirmed by the user, the result acquirer 12 prompts the user to determine whether to import wiring results into the printed circuit board database 50 by displaying a predetermined dialog (S44). Here, if the user determines to import wiring results into the printed circuit board database 50 and presses a predetermined button in the dialog window (S44, import), the result acquirer 12 temporarily registers the log of automatic wiring results in the printed circuit board database 50 (S45).

Figure 13A:
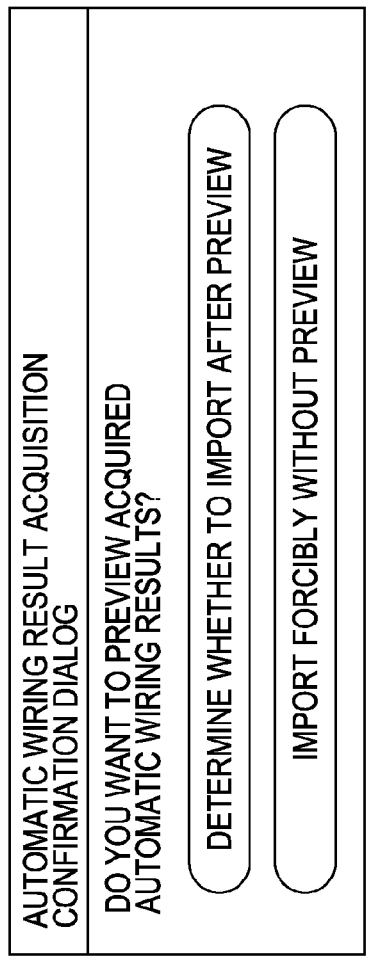
FIGS. 13A, B, and C illustrate processing from operation S42 to operation S44 according to the first embodiment.
Figure 13C:
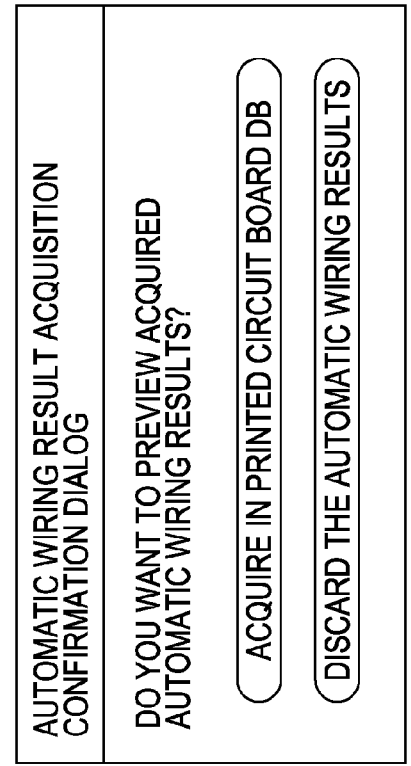
Figure 13B:
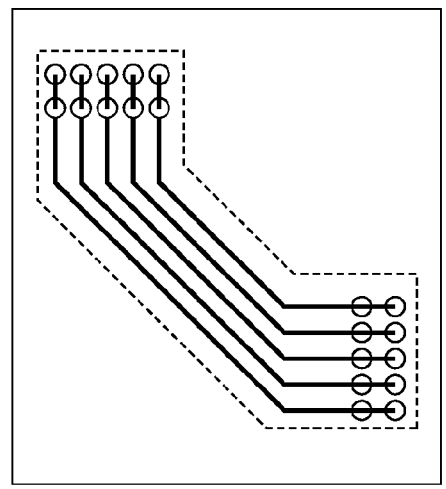

Here, screen images in processing from S42 to S44 are illustrated in FIGS. 13A, B, and C. If the "Acquire wiring results of selected line" button in the screen image illustrated in FIG. 12 is pressed, the result acquirer 12 displays a dialog window illustrated in FIG. 13A. If a "Determine whether to import after preview" button is pressed in the dialog window, the result acquirer 12 displays a preview illustrated in FIG. 13B. Then, the result acquirer 12 displays a dialog window to ask the user whether to import acquired wiring results into the printed circuit board database 50 (see FIG. 13C).

If an "Acquire in printed circuit board DB" button is pressed by the user, wiring results are reflected in the printed circuit board database 50. If, on the other hand, a "Discard the automatic wiring results" button is pressed, wiring results are directly discarded.

The description returns to the flow chart in FIG. 11. The result acquirer 12 determines whether wiring results of the wiring block conflict with those of another wiring block (a wiring block whose wiring results are already reflected in the printed circuit board database 50) (S46). Here, if a conflict occurs (S46, conflict), the result acquirer 12 notifies the user of the conflict and the user eliminates an overlapped portion between conflicting wiring blocks and then, makes a request again to the parallel execution environment 2 to perform processing with a new wiring block (processing at S2 and thereafter is performed again) (S47). If, on the other hand, the result acquirer 12 determines at S46 that no conflict occurs (S46, no conflict), the result acquirer 12 formally registers wiring results that were temporarily registered, to the printed circuit board database 50 (S48).

If a preview of wiring result is not instructed at S42 (S42, NO), processing continues to S45 and, if the user determines at S44 not to import wiring results into the printed circuit board database 50 and a predetermined button is pressed (S44, do not import), processing is stopped.

Second Embodiment

If there is a region (the degree of interference, an overlapped portion) where wiring blocks cross, wiring processing is performed on the cross region a plurality of times and LSI after wiring processing being performed thereon may have a portion where a short-circuit occurs. In the execution instruction environment 1 according to the first embodiment, if the number of regions (degree of interference) where wiring blocks cross is equal to or more than a certain value, processing is stopped (see S3 in FIG. 7). If there is any overlapped portion, processing is performed again after the overlapped portion is eliminated by the user or another system (see S46 and S47 in FIG. 11). In the second embodiment, even if there is cross region (overlapped portion), an execution instruction environment that can continue processing without stopping processing is provided.

Figure 14:
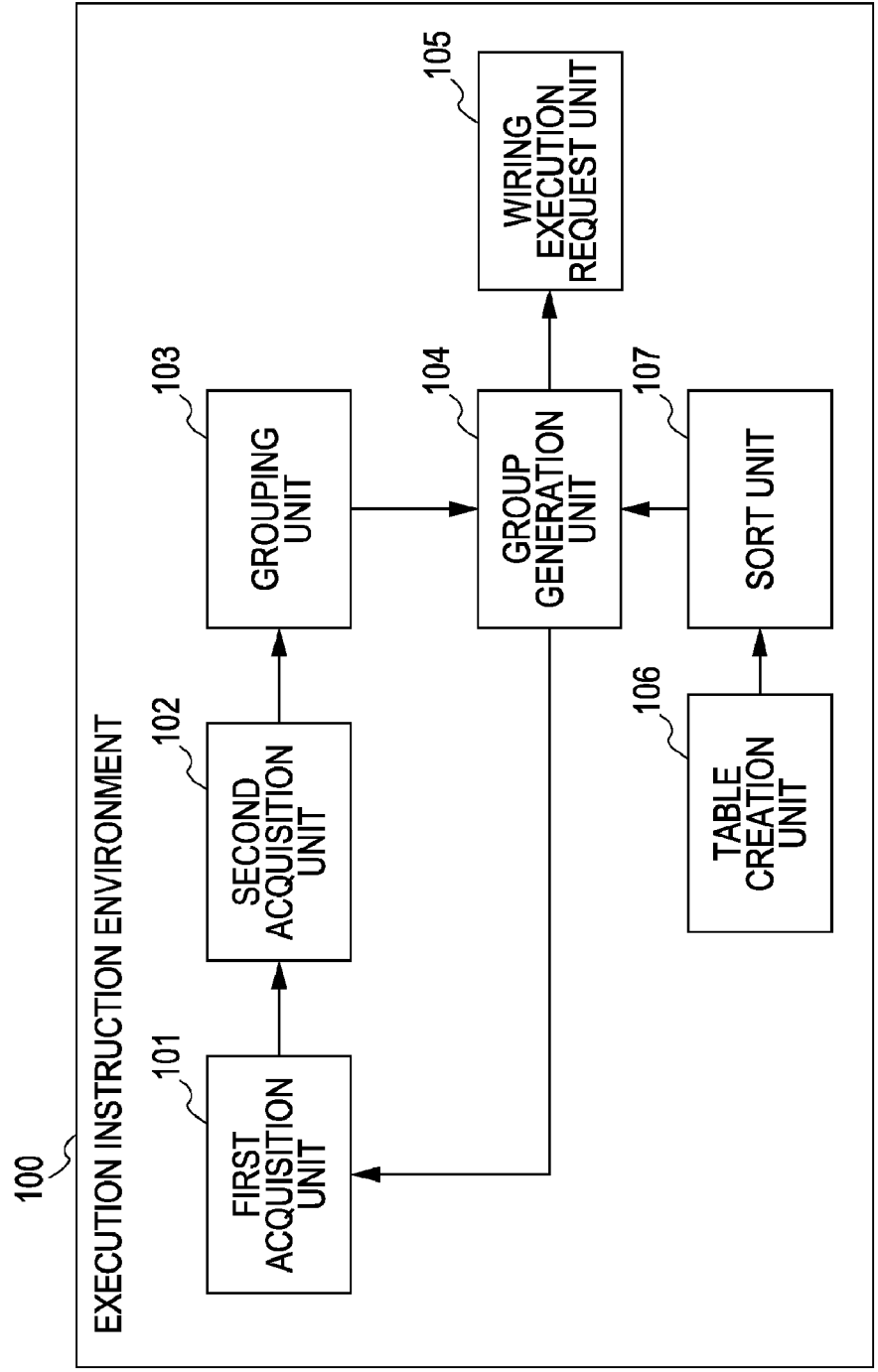
FIG. 14 illustrates the configuration of an execution instruction environment in a second embodiment.

The configuration of the execution instruction environment in the second environment is illustrated in FIG. 14. An execution instruction environment 100 (printed circuit board wiring processing apparatus) includes a first acquirer 101, a second acquirer 102, a grouper 103, a group generator 104, a wiring execution requester 105, a table creation unit 106, and a sort unit 107.

Here, each unit in the execution instruction environment 100 will be described. The first acquirer 101 acquires a wiring block (first wiring block) whose region has the maximum number of crossings with regions of other wiring blocks from a plurality of wiring blocks held in the printed circuit board database 50 and not grouped by the grouper 103 from the printed circuit board database 50.

The second acquirer 102 acquires one or a plurality of wiring blocks (second wiring blocks) from wiring blocks that are not grouped and whose region has no crossing with that of the first wiring block acquired by the first acquirer 101 from the printed circuit board database 50.

The grouper 103 groups wiring blocks acquired by the first acquirer 101 and the second acquirer 102 into one parallel execution group.

The group generator 104 generates a plurality of parallel execution groups by controlling the first acquirer 101, the second acquirer 102, and the grouper 103 so that these units operate repeatedly.

The wiring execution requester 105 makes a request to the parallel execution environment 2 (wiring execution processor) successively in units of parallel execution groups so that wiring processing on wiring blocks in a parallel execution group generated by the group generator 104 is performed in parallel in the parallel execution environment 2. When the requested wiring processing is completed, the wiring execution requester 105 makes a request to the parallel execution environment 2 so that wiring processing on wiring blocks in the next parallel execution group is performed in parallel and, if there is a region in a wiring block in the next parallel execution group where wiring processing is completed (if the wiring block on which wiring processing is performed next has a cross region and the cross region is already processed), the wiring execution requester 105 makes a request to the parallel execution environment 2 so that the region is exempted from wiring processing.

The table creation unit 106 creates a list in which a wiring block, at least one wiring block whose region crosses that of the wiring block, and the number of crossings of regions are associated for each wiring block to create a cross block table by compiling the list for each wiring block. The sort unit 107 sorts lists in a cross block table in descending order of cross number. The group generator 104 controls the first acquirer 101, the second acquirer 102, and the grouper 103 so that these units repeatedly perform processing on wiring blocks in the order sorted by the sort unit 107.

A wiring block in the second embodiment is defined in the same manner as that in the first embodiment. That is, a wiring block is a region on a printed circuit board shown as coordinate information and is defined as a region including at least one piece of wiring information between terminals wired on the printed circuit board.

Figure 15:
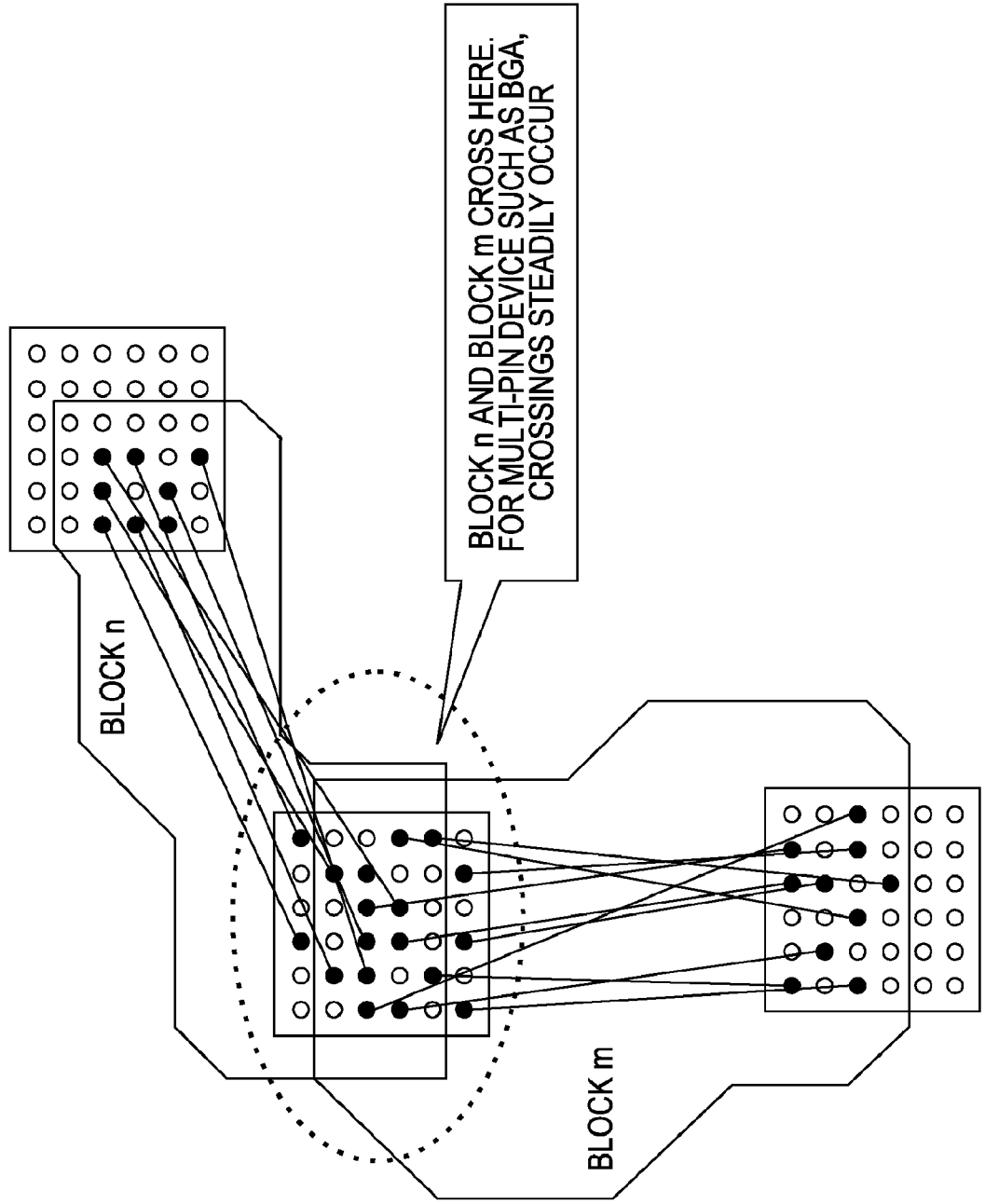
FIG. 15 illustrates a case in which a crossing of wiring blocks occurs.

A case in which a crossing of wiring blocks occurs is illustrated in FIG. 15. If, for example, as illustrated in FIG. 15, wiring blocks are defined in such a way that each of a wiring block n and a wiring block m uses a multi-pin device such as a BGA (Ball Grid Array), it becomes difficult to divide wiring blocks. Cases in which wiring blocks cross in this manner occur steadily.

Figure 16:
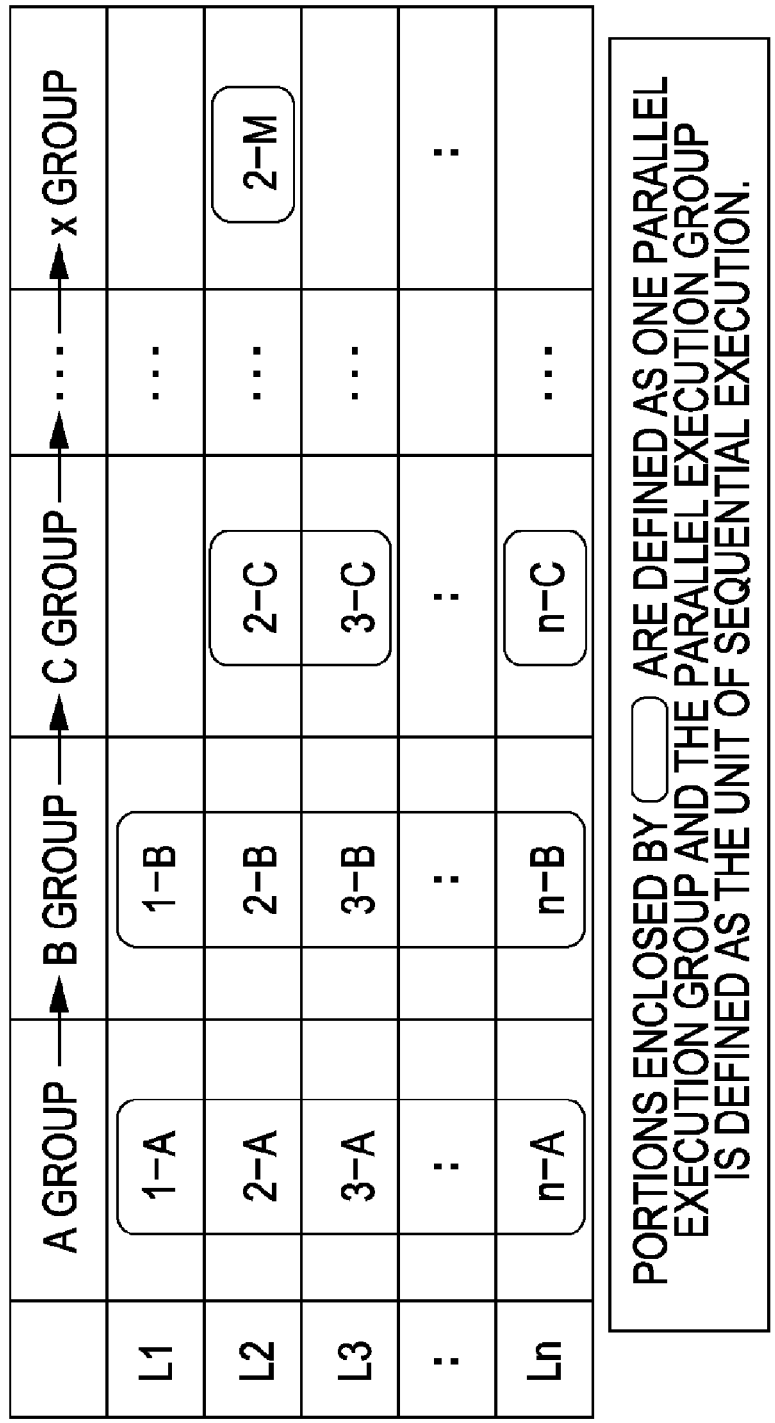
FIG. 16 illustrates the concept of a parallel execution group in the second embodiment and a method of a processing request to a parallel execution environment.

Here, the concept of a parallel execution group in the second embodiment and the method of a processing request to the parallel execution environment 2 will be described based on FIG. 16. In FIG. 16, what are denoted as 1-A, 2-A, . . . , n-A, 1-B, 2-B, . . . , n-B are wiring blocks and these wiring blocks grouped into an A group, B group, . . . , x group as parallel execution groups by the first acquirer 101, the second acquirer 102, the grouper 103, and the group generator 104 (the method of grouping will be described later). Thus, a matrix for each group is created using a crossing or wiring layer of the wiring block as a key. Based on the matrix, the wiring execution requester 105 makes a request to the parallel execution environment 2 so that wiring processing on wiring blocks in the parallel execution group is performed in parallel execution and makes a request of execution in sequence regarding parallel execution groups in the order of the A group, B group, . . . . For wiring blocks in which vias are used between wiring layers, the concerned group is further divided into subgroups for processing.

Figure 17:
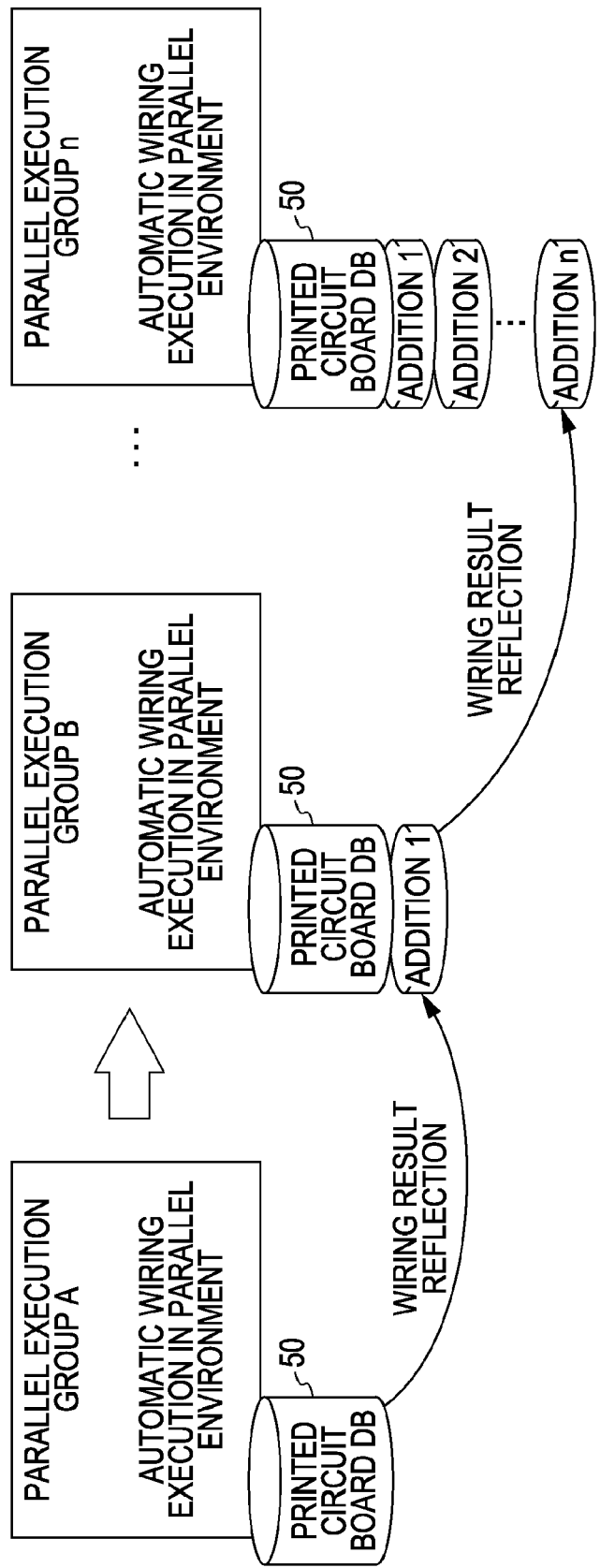
FIG. 17 illustrates an operation when wiring processing on a wiring block in the parallel execution group in the second embodiment is completed.

Next, operations after wiring processing on wiring blocks in the parallel execution group is completed will be described with reference to FIG. 17.

If, for example, wiring processing on wiring blocks in the parallel execution group A is completed, wiring processing results thereof are reflected in the printed circuit board database 50. The wiring execution requester 105 acquires data on wiring blocks in the parallel execution group B whose processing is requested next from the printed circuit board database 50 in which wiring processing results of wiring blocks in the parallel execution group A are reflected before making a request of processing. Thus, if there is any region where a wiring block in the parallel execution group A and that in the parallel execution group B cross, after wiring results of the parallel execution group A being reflected in the printed circuit board database 50, the wiring execution requester 105 exempts such a cross region from wiring processing hereafter by setting up a flag to regard such a cross region as an obstacle or the like before making a request of processing to the next parallel execution group B. This also applies when there are three parallel execution groups or more.

Figure 19:
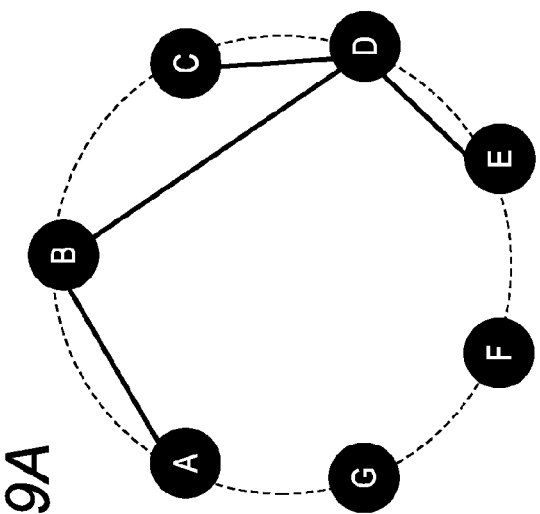
FIGS. 19A, B, and C are diagrams illustrating a generation method of a graph showing a cross relationship between wiring blocks, a cross block table, and a parallel execution group in the second embodiment.
Figure 20:
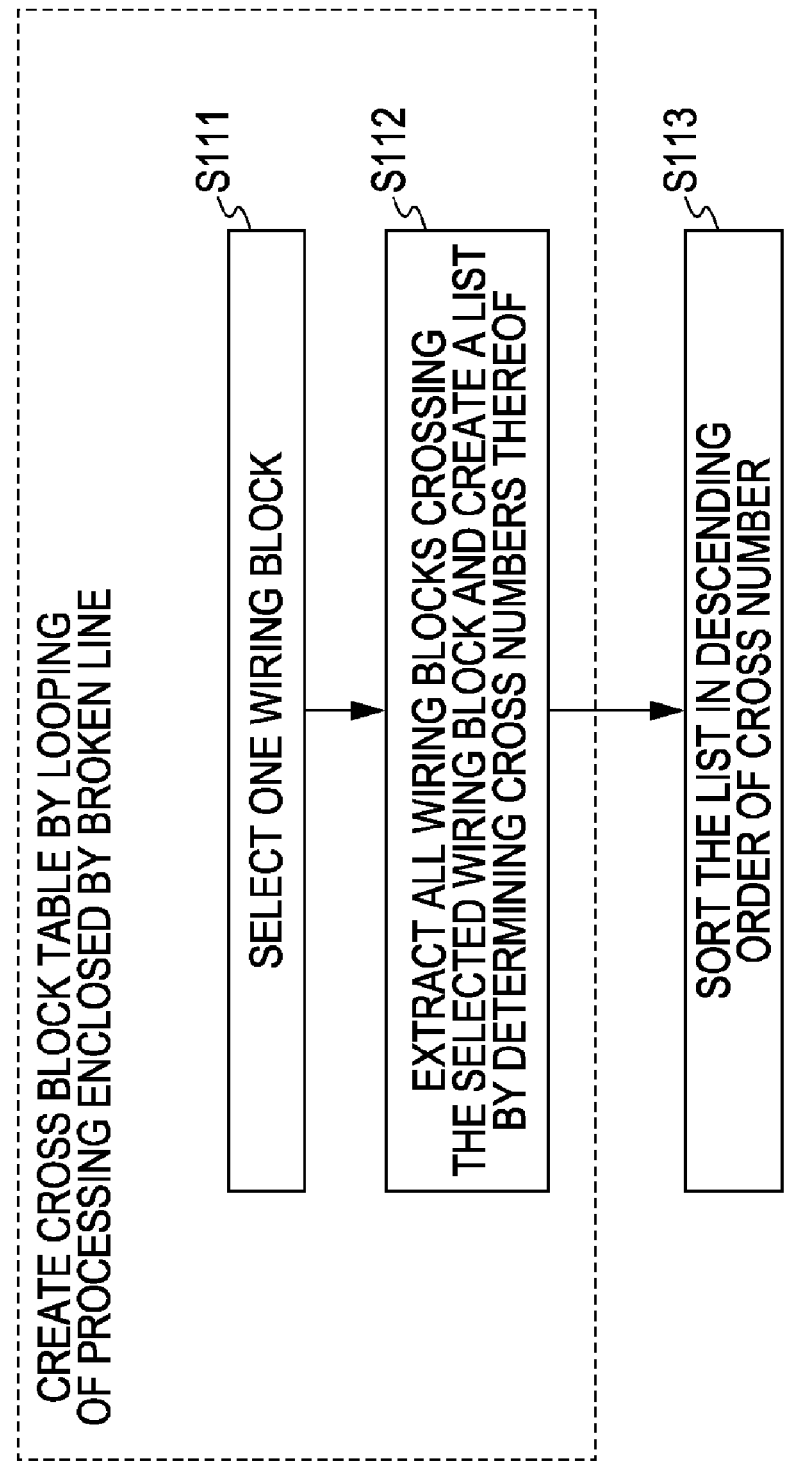
FIG. 20 illustrates creation processing of a cross block table in the second embodiment.

Next, the generation method of a parallel execution group will be described with reference to FIG. 18 to FIG. 20.

Figure 18:
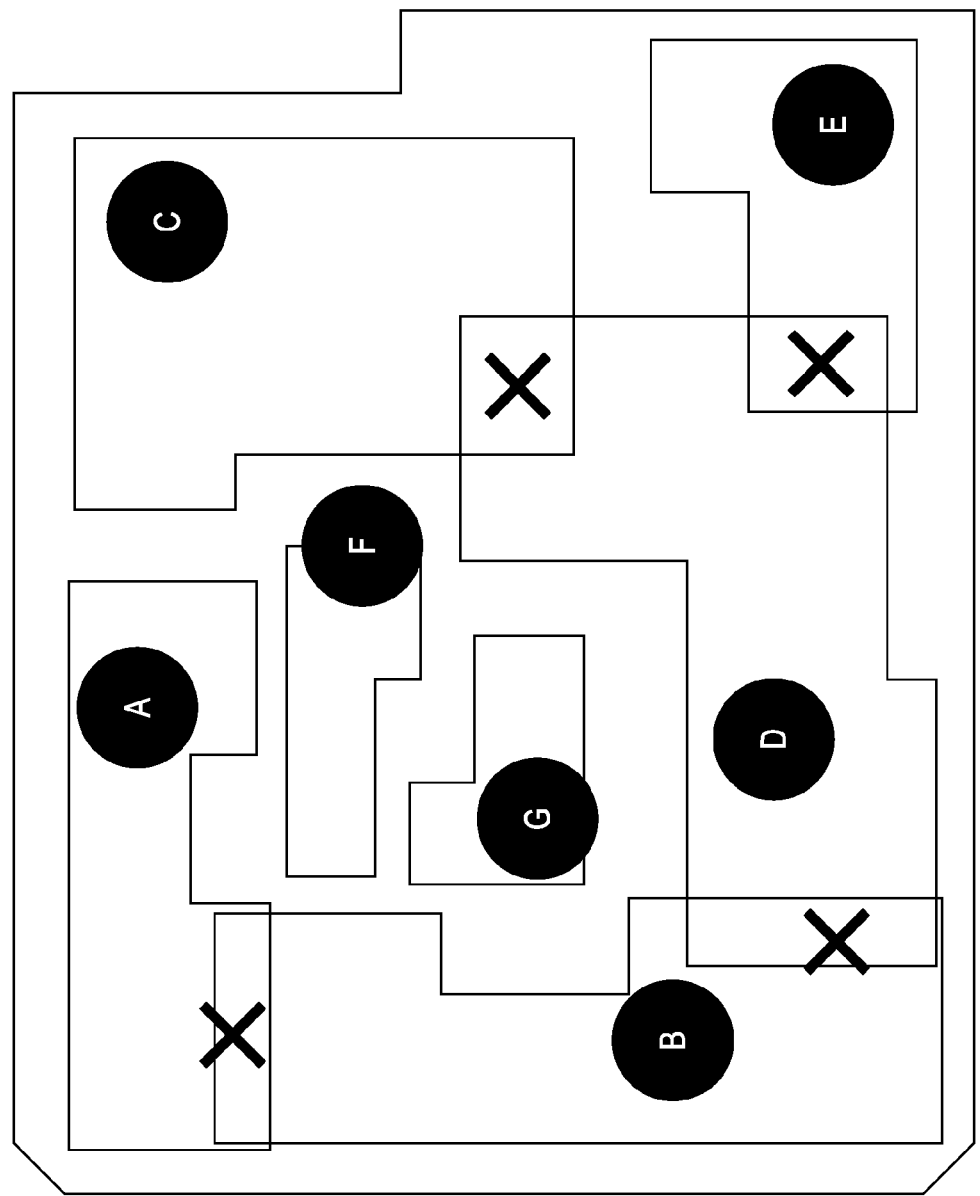
FIG. 18 illustrates an arrangement example of wiring blocks on a printed circuit board in the second embodiment.

First, it is assumed that wiring blocks A to G are defined on a printed circuit board as illustrated in FIG. 18. Cross portions are denoted by the mark X in FIG. 18.

A graph showing a cross relationship between wiring blocks in the definition of a wiring block illustrated in FIG. 18 is illustrated in FIG. 19A. A cross relationship between wiring blocks in FIG. 18 is illustrated as a solid line in FIG. 19A. That is, the wiring block A and the wiring block B cross, the wiring block B crosses the wiring blocks A and D, and the wiring block C crosses the wiring block D. Further, the wiring block D crosses the wiring blocks B, C, and E and the wiring block E crosses the wiring block D. The wiring blocks G and F do not cross any wiring block.

For the wiring blocks defined as described above, the table creation unit 106 creates a cross block table illustrated in FIG. 19B. The cross block table is a table that holds a list of associations of wiring blocks (hereinafter, denoted as cross blocks) crossing a wiring block and the number of crossings (hereinafter, denoted as the cross number) for each wiring block. While wiring blocks are arranged alphabetically in FIG. 19B, a table sorted in ascending order of cross number by the sort unit 107 may be provided to facilitate processing below.

Next, the generation method of a concrete parallel execution group conforming to the examples illustrated in FIGS. 19A and 19B will be illustrated in FIG. 19C.

First, the first acquirer 101 acquires a wiring block not grouped into a parallel execution group and having the maximum cross number in the sorting order of cross number in the cross block table from the printed circuit board database 50. That is, the wiring block D with the cross number 3 is acquired because no wiring block is grouped into a parallel execution group in the first iteration of processing.

Next, the second acquirer 102 searches and acquires one or a plurality of wiring blocks whose region does not cross the wiring block D from the cross block table. That is, the wiring block A that does not cross the wiring block D is acquired. Incidentally, here the wiring block G and F may be acquired. The wiring blocks G and F will be mentioned later.

Next, the grouper 103 groups the acquired wiring blocks (in the present example, the A group) into one parallel execution group (operation S101).

Hereinafter, the group generator 104 causes the first acquirer 101, the second acquirer 102, and the grouper 103 to perform processing similar to S101 in descending order of cross number in the cross block table to generate parallel execution groups (S102).

That is, the wiring block B is acquired because among wiring blocks currently not grouped, the wiring block having the maximum cross number is the wiring block B with the cross number 2 and also the wiring blocks C and E that are wiring blocks that do not cross the wiring block B and are not grouped are acquired. These wiring blocks B, C, and E are grouped into the parallel execution group B by the grouper 103.

Lastly, the wiring blocks F and G whose cross number is 0 are added to one of generated parallel execution groups A and B (S103) before processing of grouping is completed.

Next, creation processing of a cross block table will be described with reference to the flow chart in FIG. 20.

The table creation unit 106 selects one wiring block from the printed circuit board database 50 (operation S111). The table creation unit 106 searches the printed circuit board database 50 for all wiring blocks that cross the selected wiring block to create a list that associates the selected wiring block, crossing wiring blocks, and the cross number (S112). The table creation unit 106 creates a cross block table by repeating processing at S111 and S112.

Lastly, the sort unit 107 sorts the lists in descending order of cross number (S113).

Next, requested processing by the wiring execution requester 105 will be described with reference to the flow chart in FIG. 21.

In the above processing, after parallel execution groups of wiring blocks are formed (operation S131), the wiring execution requester 105 requests the parallel execution environment 2 to process one parallel execution group (S132). After waiting for a predetermined time (S133), the wiring execution requester 105 checks request results of the requested parallel execution group (S134). Here, if request results are incomplete (S134, incomplete), processing returns to operation S133 to perform wait processing again. If request results are complete or processing is the first processing (S134, complete), the wiring execution requester 105 acquires wiring results from the parallel execution environment 2 (S135) to reflect the request results in the printed circuit board database 50 (S136). After the request results being reflected, the wiring execution requester 105 makes a request of processing of the next parallel execution group (looping from S136 to S132).

The wiring execution requester 105 performs the processing from S132 to S136 for all parallel execution groups.

Figure 21:
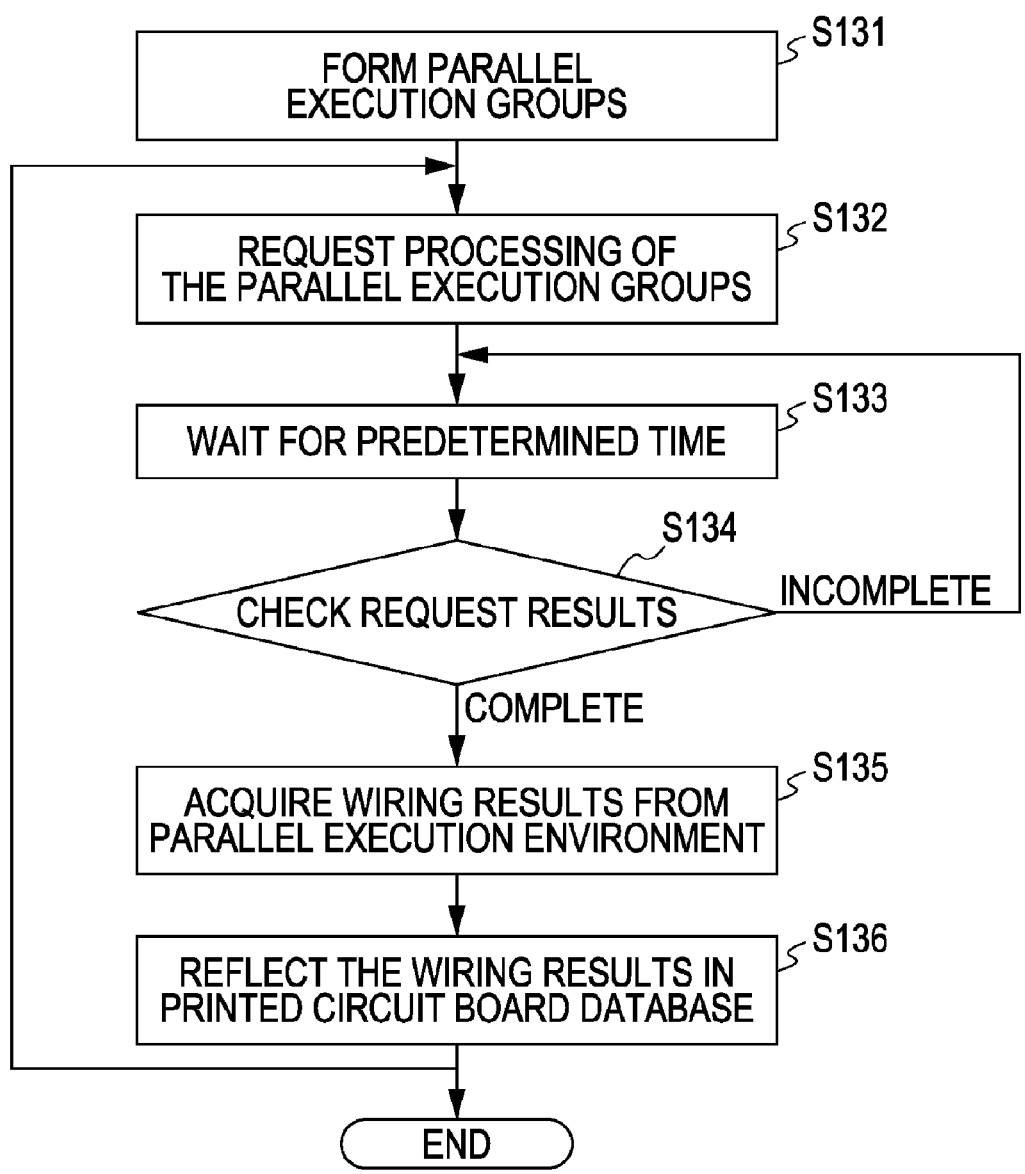
FIG. 21 illustrates request processing by a wiring execution requester in the second embodiment.

A operation of suspension determination may be inserted into the flow chart illustrated in FIG. 21 to suspend processing when "suspension" is instructed during processing of the wiring execution requester 105. The wiring execution requester 105 may also present progress of a parallel execution group to the user as a progress bar.

According to the second embodiment, a parallel execution group, which is a unit in which wiring processing can be performed in parallel, can be created.

Third Embodiment

Figures 22A, 22B:
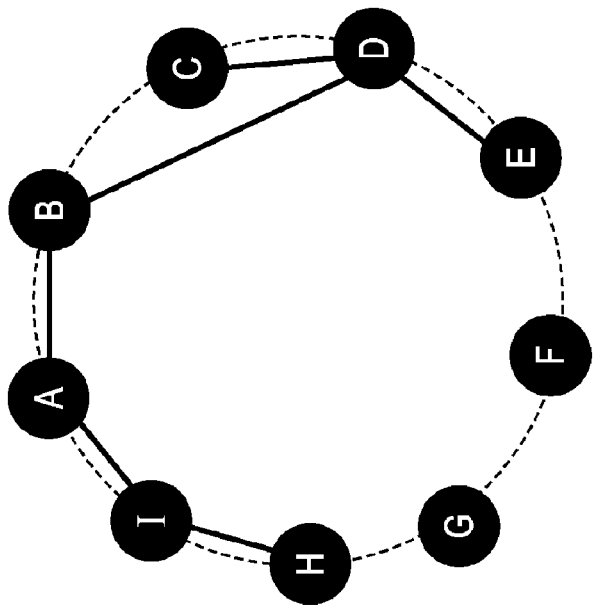
FIGS. 22A and 22B illustrate a graph showing a cross relationship between wiring blocks and a cross block table in a third embodiment.

A graph (FIG. 22A) showing a cross relationship between wiring blocks that cannot be dealt with by the execution instruction environment 100 in the second embodiment and a cross block table (FIG. 22B) are illustrated in FIG. 22. The cross relationship between wiring blocks in this example assumes that the wiring block A also shown in the second embodiment is further crossed by a wiring block I and the wiring block I is further crossed by a wiring block H (see also FIG. 19 for comparison and contrast).

In such a cross relationship, the first acquirer 101 shown in the execution instruction environment 100 of the second embodiment first acquires the wiring block D with the maximum cross number and the second acquirer 102 acquires the wiring blocks A, H, and I that do not cross the wiring block D. Then, the grouper 103 groups these wiring blocks D, A, H, and I into one parallel execution group. However, the wiring blocks A, H, and I are blocks that cross each other and therefore, wiring processing is performed on these wiring blocks simultaneously in parallel if these wiring blocks belong to the same parallel execution group and wiring results thereof will lead to a short-circuit in wiring portions of cross regions.

In the third embodiment, an execution instruction environment capable of also dealing with the above problem is presented.

First, the configuration of an execution instruction environment in the third embodiment is illustrated in FIG. 23. An execution instruction environment 200 adopts a grouper 103A that substitutes for the grouper 103 in the second embodiment and includes a same rank table creation unit 110, a same rank grouper 111, and a same rank group generator 112. Other units than the same rank table creation unit 110, the same rank grouper 111, and the same rank group generator 112 in the grouper 103A are the same as those in the second embodiment and therefore, a description thereof is not repeated here.

If there is a plurality of wiring blocks acquired by the second acquirer 102, the same rank table creation unit 110 forms these wiring blocks into a wiring block group and creates a table (hereinafter, referred to as a same rank internal cross block table) by creating a list associating a wiring block in the wiring block group, at least one wiring block whose region crosses that of the wiring block, and the cross number of regions of wiring blocks for each wiring block. That is, while a cross block table created by the table creation unit 106 is for the entire wiring blocks, a same rank internal cross block table created by the same rank table creation unit 110 is a table whose target range is wiring blocks acquired by the second acquirer 102 only.

The same rank grouper 111 groups, among lists in the same rank internal cross block table created by the same rank table creation unit 110, wiring blocks whose cross number is singular into a same rank group.

The same rank group generator 112 generates at least one same rank group by controlling the same rank table creation unit 110 and the same rank grouper 111 to operate recursively by forming a plurality of wiring blocks that are not grouped by the same rank grouper 111 into a wiring block group until the cross numbers of all lists in the created same rank internal cross block table become singular.

The grouper 103A groups wiring blocks of the same rank group having the maximum number of wiring blocks among same rank groups generated by the same rank group generator 112 and the wiring block acquired by the first acquirer 101 into a parallel execution group.

Next, the generation method of a parallel execution group by the execution instruction environment 200 from the cross relationship illustrated in FIGS. 22A and 22B will be described with reference to FIGS. 24A, B, and C.

First, the generation method when a parallel execution group is generated for the first time will be described with reference to FIG. 24A. The wiring block D (with the cross number 3) having the maximum cross number is acquired by the first acquirer 101 and then, the wiring blocks A, H, and I are acquired by the second acquirer 102.

Then, the same rank table creation unit 110 creates a same rank internal cross block table for the wiring blocks A, I, and H (see FIG. 24(*a*-1)). Here, the same rank grouper 111 groups wiring blocks whose cross number is singular (1) into a same rank group. That is, the wiring blocks A and H whose cross number is 1 are grouped into a same rank group.

Next, based on control by the same rank group generator 112, the same rank table creation unit 110 creates a same rank internal cross block table for the wiring block I whose cross number is 2 (see FIG. 24(*a*-2)). Since the cross number becomes singular (1), the same rank grouper 111 groups the wiring block I as a same rank group. The same rank group generator 112 controls the same rank table creation unit 110 and the same rank grouper 111 in this manner until the cross numbers of all lists in the same rank internal cross block table become singular.

The grouper 103A groups wiring blocks of the same rank group having the maximum number of wiring blocks among same rank groups generated in this manner (that is, the wiring blocks A and H in the same rank group in which two wiring blocks are registered) and the wiring block D acquired by the first acquirer 101 into the parallel execution group A.

The generation method of the parallel execution group B in the next stage will be described with reference to FIG. 24B. The wiring block B (with the cross number 2) having the maximum cross number among wiring blocks not formed into a parallel execution group is acquired by the first acquirer 101 and the wiring blocks C, E, and I that do not cross the wiring block B are acquired by the second acquirer 102.

The same rank table creation unit 110 creates a same rank internal cross block table for the range of the wiring blocks C, E, and I in the same manner as described above. Since the wiring blocks C, E, and I do not cross each other and are all independent of each other, the same rank grouper 111 forms the wiring blocks C, E, and I into one same rank group. Thus, the wiring blocks B, C, E, and I becomes the parallel execution group B.

Lastly, the wiring blocks F and G whose cross number is 0 are added to one of generated parallel execution groups (S103) before processing of grouping is completed.

Figure 25:
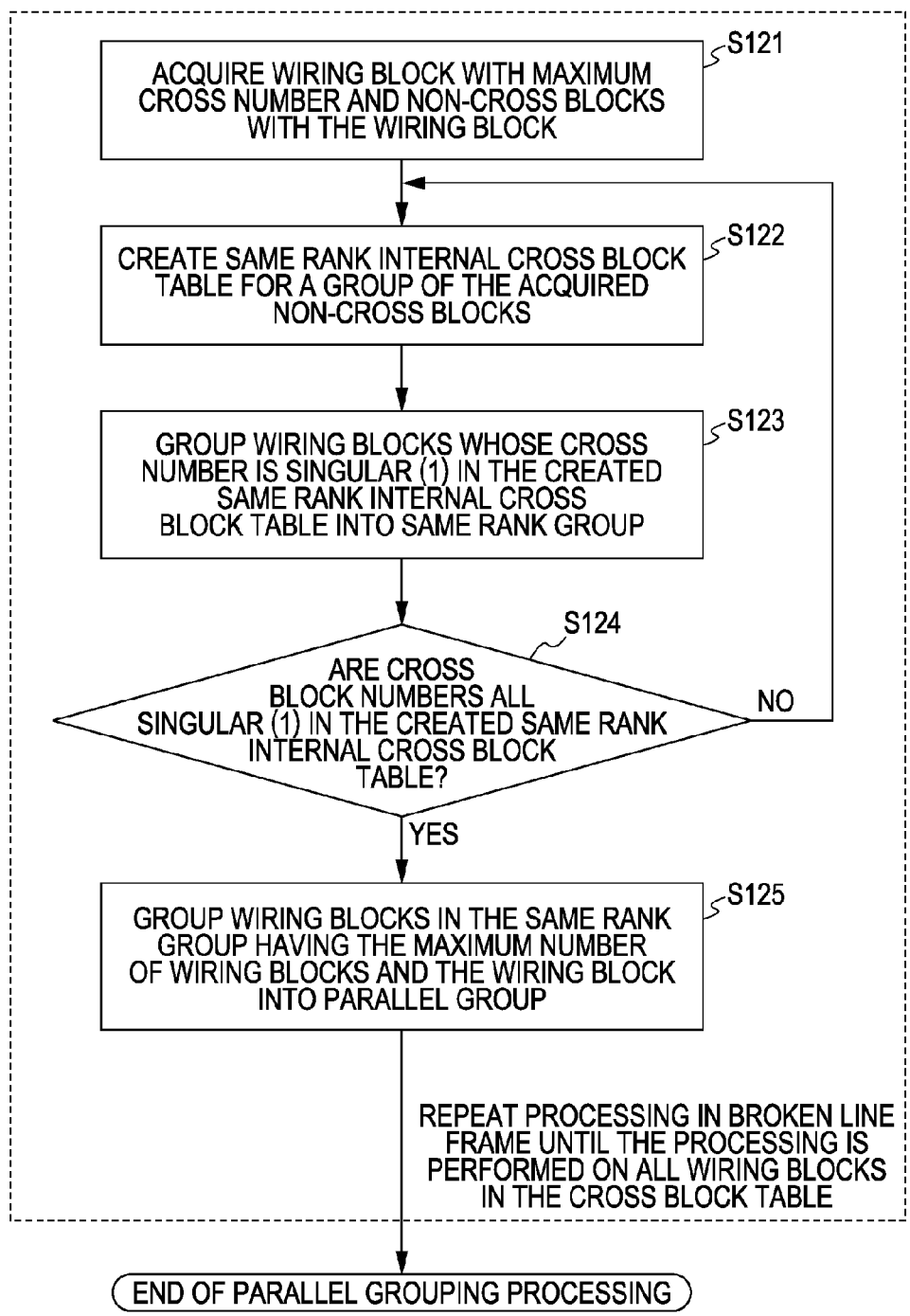
FIG. 25 illustrates the generation method of a parallel execution group in the third embodiment.

The generation method of a parallel execution group in the third embodiment is illustrated in the flow chart in FIG. 25.

The first acquirer 101 acquires a wiring block with the maximum cross number and then, the second acquirer 102 acquires non-cross wiring blocks that do not cross the wiring block (operation S121). The same rank table creation unit 110 creates a same rank internal cross block table for a group of the acquired non-cross wiring blocks (S122).

The same rank grouper 111 groups wiring blocks whose cross number is singular (1) in the created same rank internal cross block table into a same rank group (S123). Here, the same rank group generator 112 determines whether the cross numbers of all wiring blocks in the created same rank internal cross block table are singular (1) (S124).

If the cross numbers of all wiring blocks are not singular (1) (S124, NO), the same rank group generator 112 returns processing to operation S122. The same rank table creation unit 110 creates a same rank internal cross block table by forming a plurality of wiring blocks not formed into a same rank group by the same rank grouper 111 into a non-cross block group (S122). The same rank grouper 111 groups wiring blocks whose cross number is singular (1) in the created same rank internal cross block table into a same rank group (S123). In this manner, the same rank group generator 112 generates same rank groups by recursive execution of processing at operations S122 and S123 until the cross numbers of all lists in the same rank internal cross block table become singular.

If, on the other hand, the cross numbers of all wiring blocks are singular (1) (S124, YES), the grouper 103A groups wiring blocks of the same rank group having the maximum number of wiring blocks among same rank groups generated by the same rank group generator 112 and the wiring block acquired by the first acquirer 101 into a parallel execution group.

Processing at operations S121 to S125 is repeated under control of the group generator 104 until the processing is performed on all wiring blocks in the cross block table.

Figure 26:
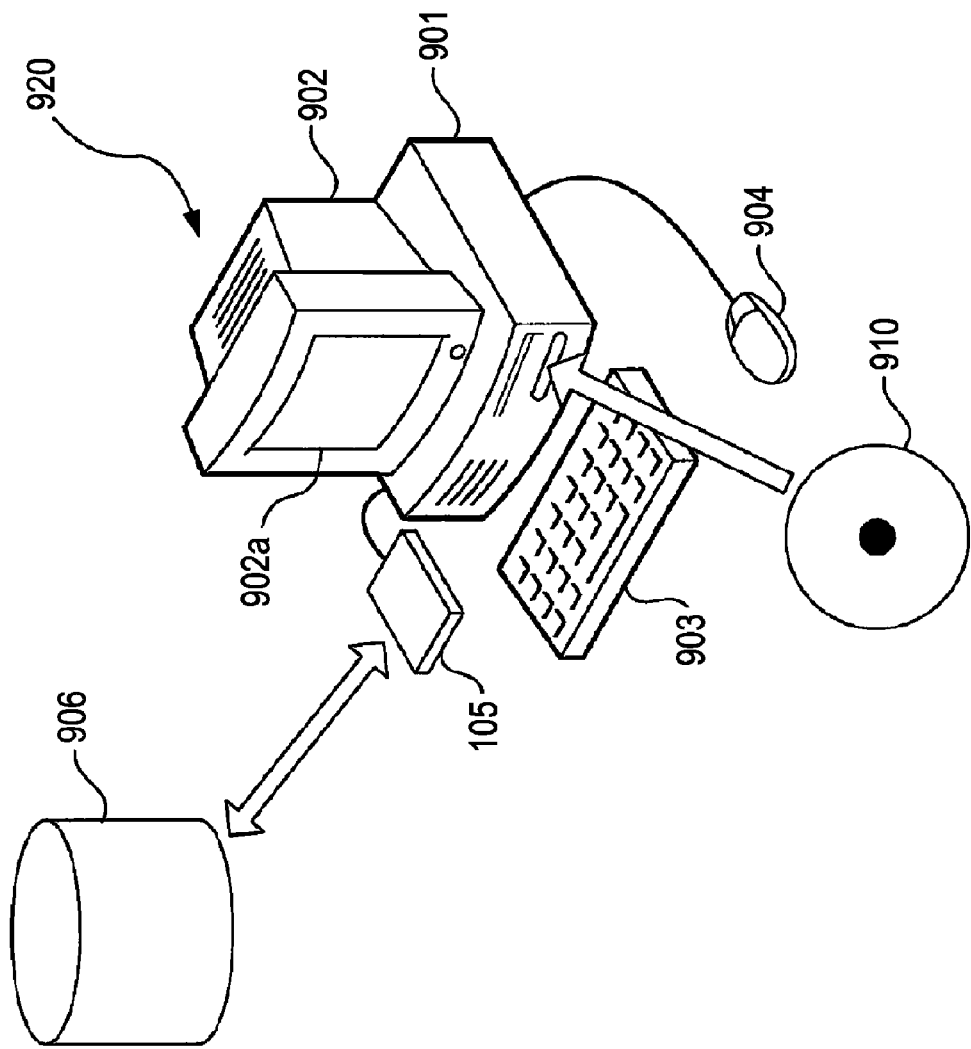
FIG. 26 illustrates a computer system applied to the embodiments.

The present invention is applicable to computer systems as shown below. FIG. 26 is a diagram illustrating an example of the computer system to which the present invention is applicable. A computer system 920 illustrated in FIG. 26 has a main body unit 901 containing a CPU, disk drive and the like, a display 902 to display images according to instructions from the main body unit 901, a keyboard 903 to input various kinds of information into the computer system 920, a mouse 904 to specify any position in a display screen 902a of the display 902, and a communication apparatus 905 to download programs or the like stored in other computer systems by accessing external databases or the like. A network communication card, modem and the like can be considered as the communication apparatus 905.

A program that causes a computer system constituting a printed circuit board wiring processing apparatus as described above to execute each of the above operations can be provided as a printed circuit board wiring processing program. The computer system constituting the printed circuit board wiring processing apparatus can be caused to execute the program after the program being caused to be stored in a recording medium that can be read by the computer system. The program that executes each of the above operations is stored in a portable recording medium such as a disk 910 or downloaded by the communication apparatus 905 from a recording medium 906 in another computer system. The printed circuit board wiring processing program (printed circuit board wiring processing software) causing the computer system 920 to have at least a printed circuit board wiring processing function is compiled after being input into the computer system 920. The program causes the computer system 920 to operate as a printed circuit board wiring processing system having the printed circuit board wiring processing function. The program may be stored in a computer readable recording medium such as the disk 910. Recording media that can be read by the computer system 920 include an internal storage device installed inside a computer such as a ROM and RAM, a portable recording medium such as the disk 110, a flexible disk, DVD disk, magneto-optical disk, and IC card, and various kinds of recording media accessible from a database holding computer programs, another computer system and its database, or a computer system connected via a communication means such as the communication apparatus 105.

FIG. 27 is a diagram illustrating an example of the hardware configuration of the main body unit 901 of the computer system 920. The main body unit 901 includes a CPU (Central Processing Unit) 951, a memory 952, a disk drive 953 to read/write data to/from a portable recording medium such as the disk 910, and an HDD (Hard disk drive) 954, which is a nonvolatile storage means. Each of the above units is realized by a program held in advance in a nonvolatile storage means such as the HDD 954 and the disk 910 cooperating with hardware resources such as the CPU 951 and the memory 952.

A computer may be caused to have each function of the execution instruction environment 1, 100, 200 and the parallel execution environment 2 in the embodiments to provide the computer as a printed circuit board wiring processing apparatus.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A wiring design apparatus comprising:
    a first acquirer that acquires a first wiring block whose region has a maximum number of crossings with regions of other wiring blocks from printed circuit board data of a printed circuit board having a plurality of wiring blocks a wiring layer;
    a second acquirer that acquires second wiring blocks whose region does not cross the first wiring block from the printed circuit board data; and
    a wiring execution requester that causes a wiring processor to perform wiring processing on the first wiring block and the second wiring blocks in parallel.

2. The wiring design apparatus according to claim 1, further comprising:
    a grouper that groups the first wiring block and the second wiring blocks into one group; and
    a group generator that generates a plurality of groups by exercising control so that the first acquirer, the second acquirer, and the grouper operate repeatedly,
    wherein the wiring execution requester causes the wiring processor to perform wiring processing in units of the groups generated by the group generator.

3. The wiring design apparatus according to claim 2, further comprising:
    a table creation unit that creates a table by creating a list associating a wiring block, at least one wiring block whose region crosses the wiring block, and a cross number of regions for each wiring block; and
    a sort unit that sorts lists in the table in descending order of the cross number,
    wherein the first acquirer acquires the first wiring block having the maximum number of crossings based on sort results by the sort unit.

4. The wiring design apparatus according to claim 2, further comprising:
    a same rank grouper that groups, among the second wiring blocks, wiring blocks whose cross number is singular into a same rank group,
    wherein the group generator groups wiring blocks of the same rank group and the first wiring block into one group.

5. A wiring method, comprising:
    acquiring a first wiring block whose region has a maximum number of crossings with regions of other wiring blocks from printed circuit board data of a printed circuit board having a plurality of wiring blocks on a wiring layer;
    acquiring second wiring blocks whose region does not cross the first wiring block from the printed circuit board data; and
    causing a wiring processor to perform wiring processing on the first wiring block and the second wiring blocks in parallel.

6. The wiring method according to claim 5, further comprising:
    grouping the first wiring block and the second wiring blocks into one group; and generating a plurality of groups by performing acquisition of the first wiring block, acquisition of the second wiring block, and the grouping repeatedly, wherein the wiring processor is caused to perform wiring processing in units of the generated groups.

7. The wiring method according to claim 6, further comprising:

creating a table by creating a list associating a wiring block, at least one wiring block whose region crosses the wiring block, and a cross number of regions for each wiring block; and sorting lists in the table in descending order of the cross number, wherein the first wiring block having the maximum number of crossings is acquired based on sort results.

8. The wiring method according to claim 6, further comprising:

grouping, among the second wiring blocks, wiring blocks whose cross number is singular into a same rank group, wherein wiring blocks of the same rank group and the first wiring block are grouped into one group.

* * * * *

UNITED STATES PATENT AND TRADEMARK OFFICE
CERTIFICATE OF CORRECTION

PATENT NO. : 8,307,322 B2  Page 1 of 1
APPLICATION NO. : 12/574071
DATED : November 6, 2012
INVENTOR(S) : Eiichi Konno et al.

It is certified that error appears in the above-identified patent and that said Letters Patent is hereby corrected as shown below:

Column 16, Line 17, In Claim 1, delete "blocks a" and insert -- blocks on a --, therefor.

Signed and Sealed this
Fifth Day of March, 2013

Teresa Stanek Rea
*Acting Director of the United States Patent and Trademark Office*